(12) United States Patent
Kita

(10) Patent No.: US 6,289,493 B1
(45) Date of Patent: Sep. 11, 2001

(54) LAYOUT EDITOR AND ITS TEXT GENERATING METHOD

(75) Inventor: Yumiko Kita, Kanagawa (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/015,036

(22) Filed: Jan. 28, 1998

(30) Foreign Application Priority Data

Jan. 30, 1997 (JP) .................................................... 9-016609

(51) Int. Cl.[7] .................................................. G06F 17/00
(52) U.S. Cl. .................................................. 716/11; 716/5
(58) Field of Search .............................. 709/213; 716/5, 716/9, 11, 12, 10

(56) References Cited

U.S. PATENT DOCUMENTS

| | | | |
|---|---|---|---|
| 5,610,832 | * | 3/1997 | Wikle et al. ............................ 716/11 |
| 5,818,727 | * | 10/1998 | Sekiguchi ............................... 716/18 |
| 6,009,251 | * | 12/1999 | Ho et al. ................................ 716/5 |
| 6,035,111 | * | 3/2000 | Suzuki et al. ........................... 716/11 |
| 6,128,768 | * | 10/2000 | Ho ........................................... 716/5 |
| 6,155,725 | * | 12/2000 | Scepanovic et al. .................... 716/9 |

FOREIGN PATENT DOCUMENTS 4-227588   8/1992 (JP) .

* cited by examiner

*Primary Examiner*—Matthew Smith
*Assistant Examiner*—Walter Benson
(74) *Attorney, Agent, or Firm*—Scully, Scott Murphy & Presser

(57) ABSTRACT

A layout editor comprises a text attachment condition specifying unit for specifying attachment condition of a text, a text generation area specifying unit for specifying a text generation area, a specified area information extracting unit for extracting the coordinates of the text generation area and necessary information, a specified area/graphic data AND generating unit for performing an AND operation of the coordinates of the specified area and the graphic data of the graphic table, a signal name extracting unit for extracting signal name of the graphic data corresponding to the AND output, a text generation judging unit for judging the manner of text generation, and a text generating unit for generating or deleting a text according to the judgement result by the text generation judging unit corresponding to the attachment condition by the text attachment condition specifying unit.

14 Claims, 22 Drawing Sheets

LAYOUT EDITOR AND ITS TEXT GENERATING METHOD

BACKGROUNDS OF THE INVENTION

1. Field of the Invention

The present invention relates to a layout editor and its text generating method, and more particularly to a layout editor and its text generating method for use in semi-custom design or full-custom design in the mask design of IC.

2. Description of the Related Art

Generally, a net-driven tool is on the assumption of automatic wiring in many cases. In the other words, the tool itself needs no text and thereafter it has no function of text generation. A text is generally generated by user's input depending on the necessity in case of examining the wiring configuration with reference to the halfway results, or executing a work to be continued to another layout area, a layout-circuit comparison in the verification, or data modification. This kind of conventional text generating method has a data base-storing area including a graphic table for storing graphical information, a connection table for storing connection information, a correspondence table for storing the correspondence between the connection information and the graphical information, in the net-driven layout data base.

FIG. 23 is a flow chart showing the procedure of the text generating method by the conventional layout editor. With reference to FIG. 23, a first signal of the connection table is taken out from a temporary area SIG for processing a signal name taken out from the connection table (Step 2301). A temporary area SVP for correspondingly processing the signal taken out from the correspondence table is extracted (Step 2302). In this case, a temporary area SVP first detected in the correspondence table is adopted because a plurality of temporary areas SVPs exist in the correspondence table of one temporary area SIG. The coordinates of origin of a temporary area POL for processing the graphic corresponding to the temporary area SVP are extracted from the graphic table included in the data base-storing area, according to the adopted corresponding temporary area SVP (Step 2303). A text is generated on the origin of this temporary area POL (Step 2304). Here, a text for one temporary area SIG is generated at one position. Generally, when the path of a temporary area SIG is complicated and there exist a plurality of temporary areas SVPs corresponding to the temporary area SIG (for example, 50 and the more), it is difficult to know where the text exists and therefore it is very difficult to recognize the signal name by the text with eyes. It is judged whether the temporary area SIG is the last signal of the connection table or not (Step 2305). When it is not judged that the temporary area SIG is the last signal of the connection table, the next signal of the connection table in the temporary area SIG is taken out (Step 2306), the above processing will be repeated until when it is judged that the temporary area SIG is the last signal in Step 2305, and thereafter the processing will be stopped.

FIG. 24 is a flow chart showing another procedure of the text generating method by the conventional layout editor. With reference to FIG. 24, a temporary area SVP first retrieved from the correspondence table is taken out and adopted as the first temporary area SVP of the correspondence table (Step 2401). The coordinates of origin of a temporary area POL for processing the graphic corresponding to a temporary area SIG, according to the first temporary area SVP, is extracted from the graphic table included in the data base storing area (Step 2402). A text is generated on the coordinates of the origin of the temporary area POL and a text for one temporary area SIG is established at one position (Step 2403). Generally, when the path of a temporary area SIG is complicated and there exist a plurality of temporary areas SVPs corresponding to the temporary area SIG for example, 50 and the more), it is difficult to know where the text exists and therefore it is very difficult to recognize the signal name by the text with eyes. It is judged whether the temporary area SVP is the last signal of the connection table or not (Step 2404). When it is not judged that the temporary area SVP is the last signal of the connection table, the next temporary area SVP in the correspondence table is taken out (Step 2405), the above processing will be repeated until when it is judged that the temporary area SVP is the last signal of the connection table in Step 2404, and then the processing will be stopped.

The above two text generating methods may generate a text at the position inefficient in doing the work of the post-processing. In case of the text generating method shown in FIG. 24, the graphic table is retrieved with respect to all the corresponding temporary areas SVPs within the correspondence table and a text is generated on the coordinates of each origin of all the retrieved temporary areas POLS. Accordingly, texts may overlap with each other depending on the shape of a graphic, with the difficulty in their recognition, or the data amount may be extremely increased depending on a text. As a technique for making a text easy to see, there is a technique disclosed in, for example, Japanese Patent Laying-Open (Kokai) No. Heisei 4-227588, entitled "Graphic Data Output Device". This publication discloses a technique for making a text easy to see by revolving the text which is difficult to see because of overlapping with the other, the technique comprising text extracting means for extracting a text overlapping with another text, frequency measuring means for measuring the frequency that a text overlaps with another text, at every possible angle of the overlapping text, and angle changing means for changing the angle of the overlapping text to the angle having the minimum frequency. Although the conventional technique can make a text easy to see, which is difficult to see because of overlapping with another one, it is not to solve the problem that a text doesn't exist at the position where a viewer can see it easily and it is impossible to generate a text at the position efficient in doing the work of the post-processing.

As mentioned above, the conventional text generating method of the layout editor may generate a text at the position where a viewer cannot see it easily, thereby making it difficult to recognize the text.

When a text is generated on the whole graphics each having a signal name, the necessary data is extremely increased in the amount and the time spent in the data access also becomes enormous.

These two defects will become a further problem for the work of the post-processing after the text generation because a text is not generated at the proper position.

SUMMARY OF THE INVENTION

An object of the present invention is to provide a layout editor and its text generating method capable of automatically generating a text at the position easy to see for a viewer without any miss and making it easy to recognize the text.

Another object of the present invention is, in addition to the above object, to provide a layout editor and its text generating method capable of shortening the data access time and improving the working efficiency by optimizing the data amount accompanying the text generation.

According to the first aspect of the invention, a layout editor for use in a CAD system for the purpose of semiconductor integrated circuit design or the like, comprises text attachment condition specifying means for specifying an attachment condition for a text to be generated, in order to generate a given text;

text generation area specifying means, receiving the attachment condition specified by the text attachment condition specifying means, for specifying a text generation area by user's input;

specified area information extracting means for extracting the coordinates of the specified area according to the specification information specified by the text generation area specifying means and extracting necessary information from a connection table, a graphics/signals correspondence table, and a graphic table;

specified area/graphic data AND generating means for performing an AND operation of the graphic data of the graphic table and the coordinates of the specified area extracted by the specified area information extracting means;

signal name extracting means for extracting signal name of the graphic data corresponding to the AND output by the specified area/graphic data AND generating means;

signal list extracting means for extracting connection information from the connection table, to create a signal list;

existing text list extracting means for extracting the graphic data corresponding to an existing text which meets the attachment condition specified by the text attachment condition specifying means, from the graphic table, to create an existing text list;

text generation judging means, receiving the attachment condition specified by the text attachment condition specifying means and the signal name extracted by the signal name extracting means, for judging the manner of text generation with reference to the signal list and the existing text list; and text generating means for generating or deleting a text according to the judgement result by the text generation judging means in correspondence with the attachment condition by the text attachment condition specifying means.

In the preferred construction, the text generation area specifying means specifies a text generation area according to a given graphic received by user's input with a given pointing device.

In the preferred construction, the text generation area specifying means specifies a text generation area according to a given line received by user's input with a given pointing device.

In another preferred construction, the text generation area specifying means specifies a text generation area according to a given rectangle received by user's input with a given pointing device.

In another preferred construction, the text generation area specifying means specifies a text generation area, by user's specifying a layout area that is the subject of text generation according to a particular format.

In another preferred construction, the text generation area specifying means specifies a text generation area by user's specifying a block boundary that is the subject of text generation according to a particular format.

According to the second aspect of the invention, a text generating method in a layout editor for use in a CAD system for the purpose of semiconductor integrated circuit design or the like, comprising the steps of:

a step of specifying an attachment condition including the manner of text generation;

a step of specifying a text generation area;

a step of obtaining all the graphic data of the graphic on which a text should be generated, according to the attachment condition specified by the attachment condition specifying step and the information on the text generation area specified by the text generation area specifying step;

a step of obtaining all the signal names of the graphic data obtained by the graphic data obtaining step;

a step of judging whether or not to generate a text of each signal name obtained by the signal name obtaining step, according to a given rule depending on the manner of the text generation in the attachment condition specified by the attachment condition specifying step; and a step of generating a text judged to be generated by the judging step, in the text generation area specified by the text generation area specifying step.

In the preferred construction, the text generation area specifying step includes a step of indicating a text generation area by user's input, a step of extracting the coordinates of the area specified by the text generation area indicating step, and a step of calculating the AND of the given graphic data and the area specified by the text generation area indicating step.

In the preferred construction, the text generation area specifying step includes a step of indicating a layout area to generate a text by user's input, a step of indicating another layout area overlapping with the above-mentioned layout area specified by the text generation area indicating step, a step of extracting the coordinates of a boundary of the overlapped portion of the layout area specified by the text generation area indicating step and the other layout area specified by the overlapped area indicating step, and a step of calculating the AND of the coordinates of the boundary extracted by the coordinates extracting step and the given graphic data.

In another preferred construction, the text generation area specifying step includes a step of indicating a block boundary to generate a text by user's input, a step of extracting a port list according to the given connection table, and instead of the step of obtaining all the graphic data of the graphic on which a text should be generated, according to the attachment condition specified by the attachment condition specifying step and the information on the text generation area specified by the text generation area specifying step and the step of obtaining all the signal names of the graphic data obtained by the graphic data obtaining step, further includes a step of obtaining all the connection information with respect to input/output contact of the block boundary to generate a text, according to the attachment condition specified by the attachment condition specifying step and the port list extracted by the port list extracting step of the text generation area specifying step, and a step of obtaining all the signal names of the connection signal corresponding to the connection information obtained by the connection information obtaining step.

According to another aspect of the invention, a computer readable memory storing a computer program for controlling a layout editor for use in a CAD system for the purpose of semiconductor integrated circuit design or the like, the computer program comprising the steps of:

a step of specifying an attachment condition including the manner of text generation;

a step of specifying a text generation area;

a step of obtaining all the graphic data of the graphic on which a text should be generated, according to the attachment condition specified by the attachment condition specifying step and the information on the text generation area specified by the text generation area specifying step;

a step of obtaining all the signal names of the graphic data obtained by the graphic data obtaining step;

a step of judging whether or not to generate a text of each signal name obtained by the signal name obtaining step, according to a given rule depending on the manner of the text generation in the attachment condition specified by the attachment condition specifying step; and a step of generating a text judged to be generated by the judging step, in the text generation area specified by the text generation area specifying step.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
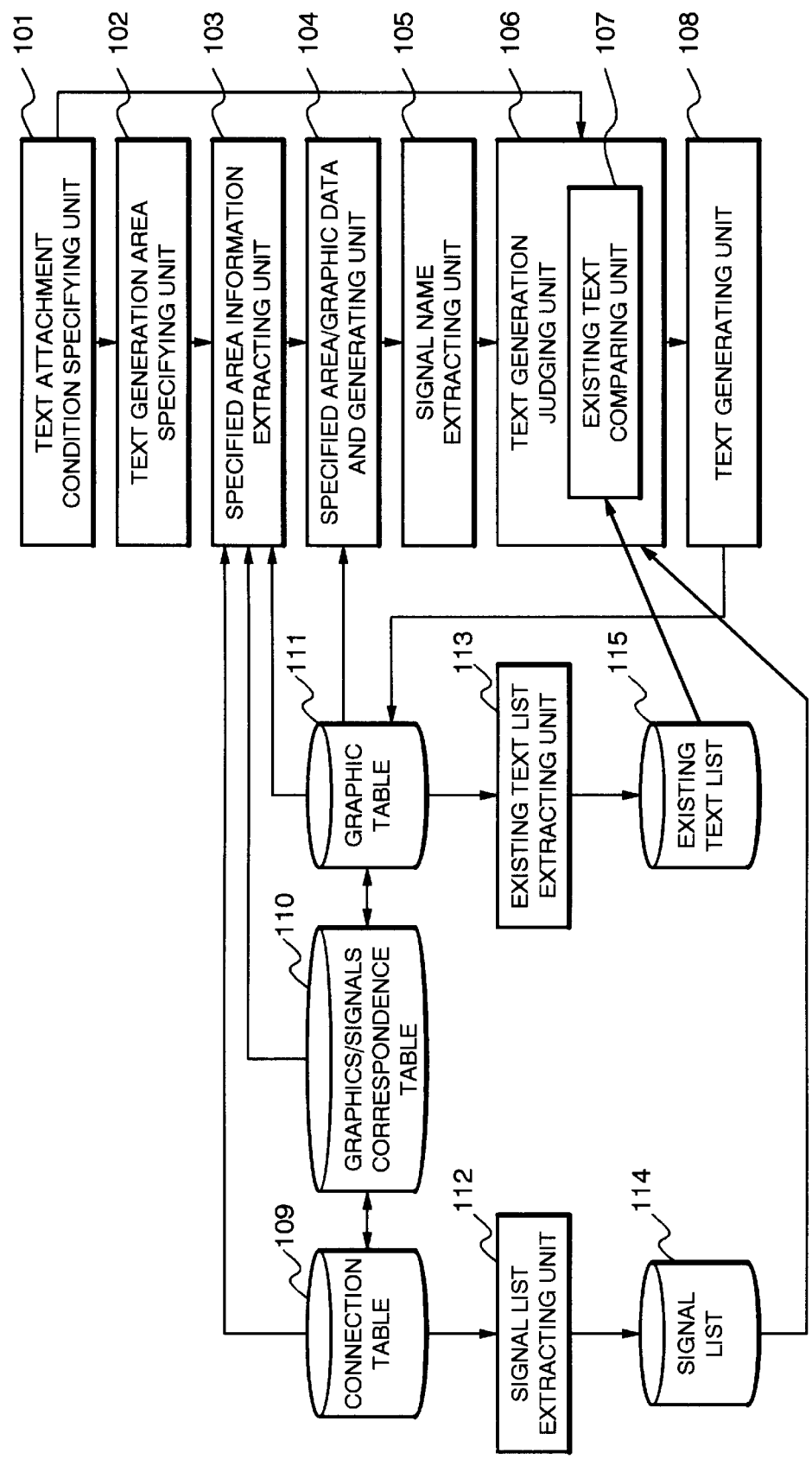
FIG. 1 is a block diagram showing the constitution of a layout editor according to an embodiment of the present invention.
Figure 2:
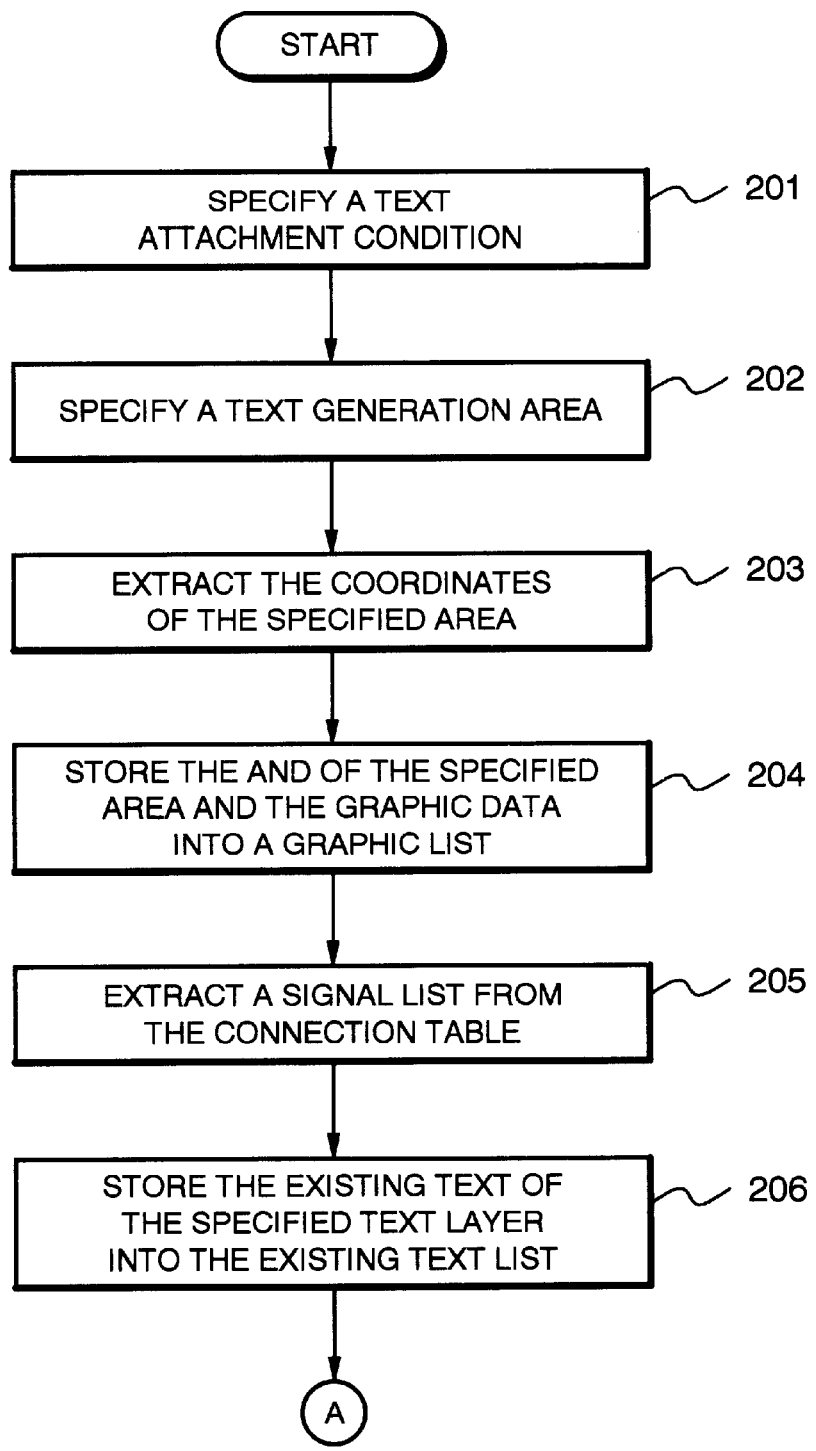
FIG. 2 is a flow chart showing a text generating method according to the embodiment and a view showing the operation in the case where a text generation specified area is formed by the line or the rectangle.
Figure 3:
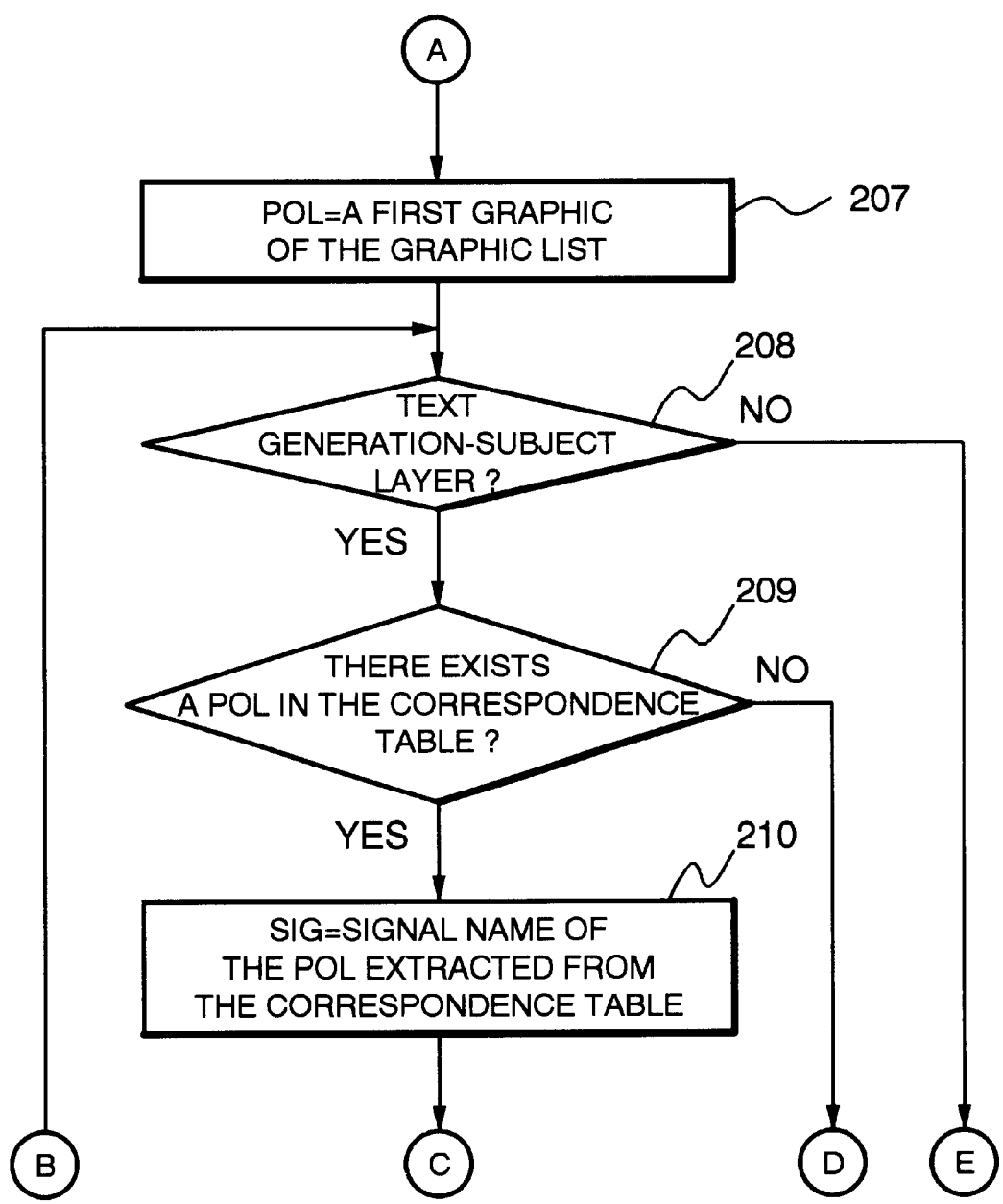
FIG. 3 is a flow chart showing the text generating method according to the embodiment and a view showing the operation in the case where a text generation specified area is formed by the line or the rectangle.
Figure 4:
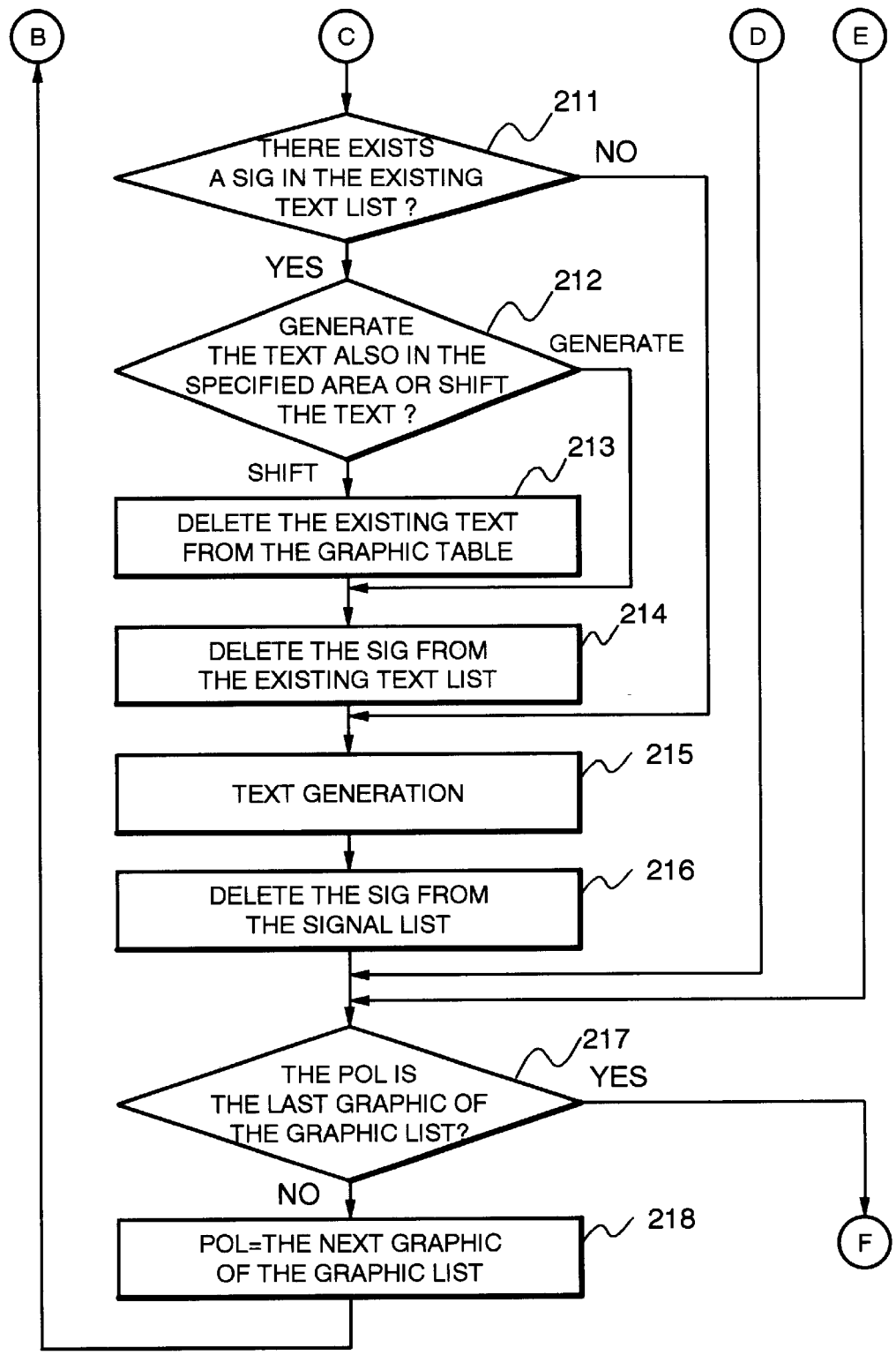
FIG. 4 is a flow chart showing the text generating method according to the embodiment and a view showing the operation in the case where a text generation specified area is formed by the line or the rectangle.
Figure 5:
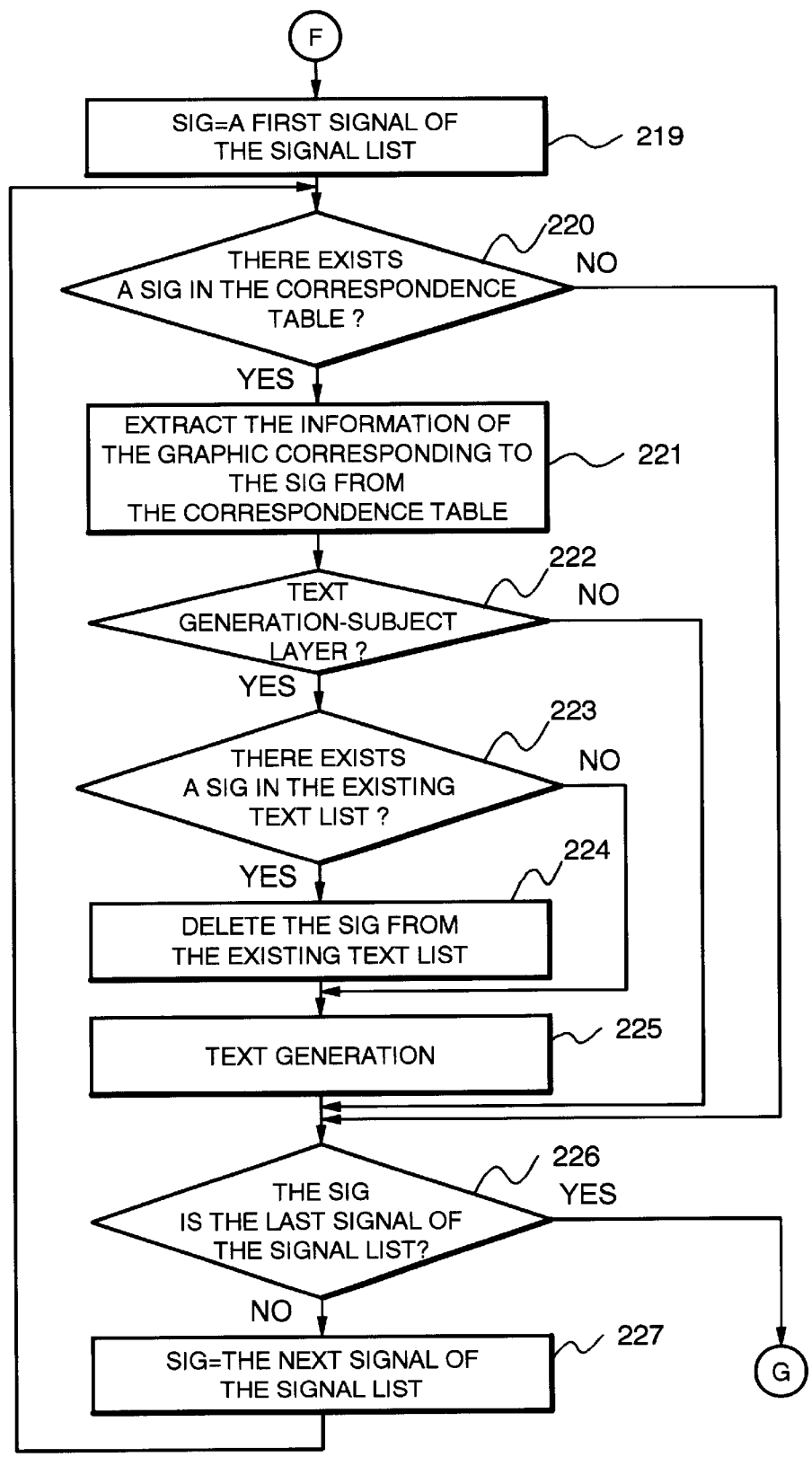
FIG. 5 is a flow chart showing the text generating method according to the embodiment and a view showing the operation in the case where a text generation specified area is formed by the line or the rectangle.
Figure 6:
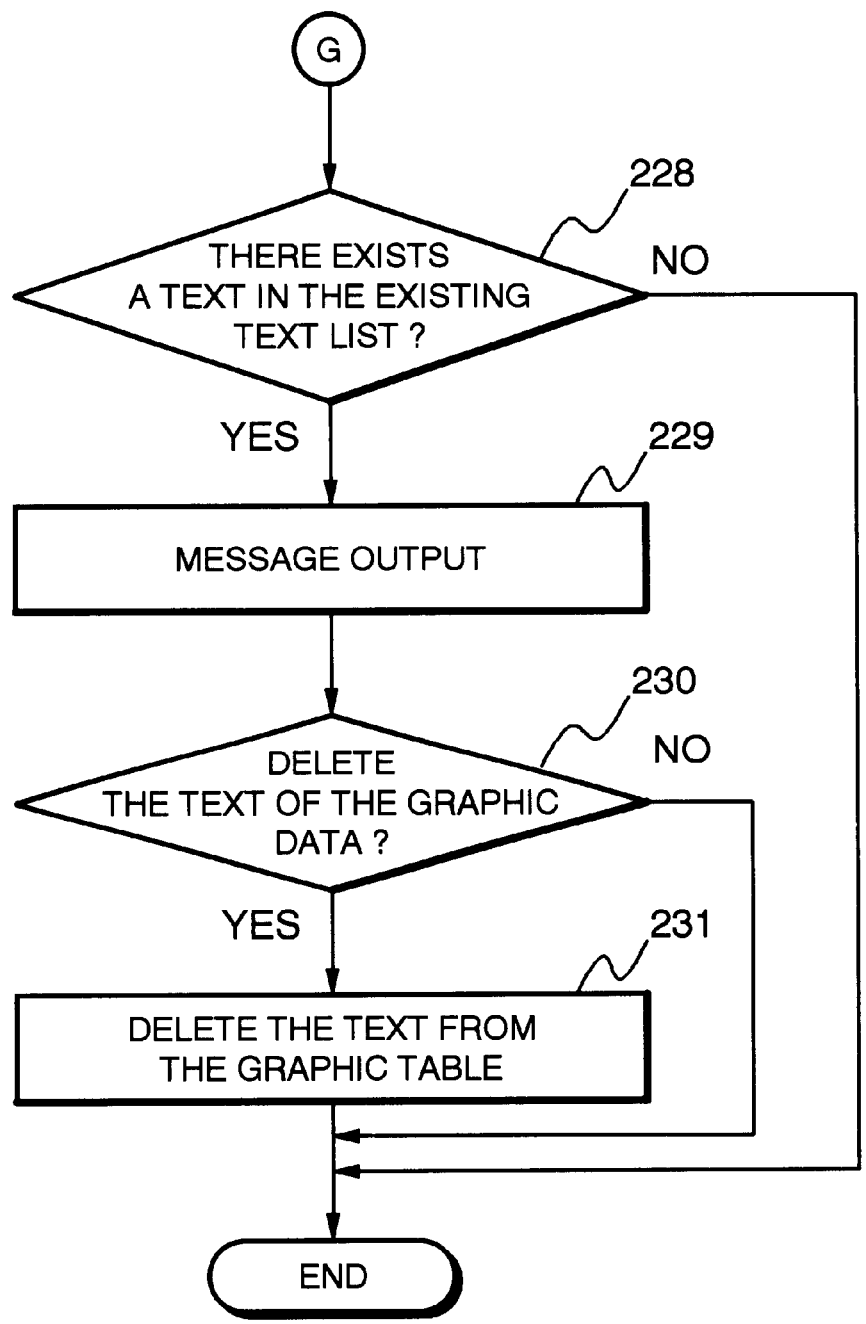
FIG. 6 is a flow chart showing the text generating method according to the embodiment and a view showing the operation in the case where a text generation specified area is formed by the line or the rectangle.
Figure 7:
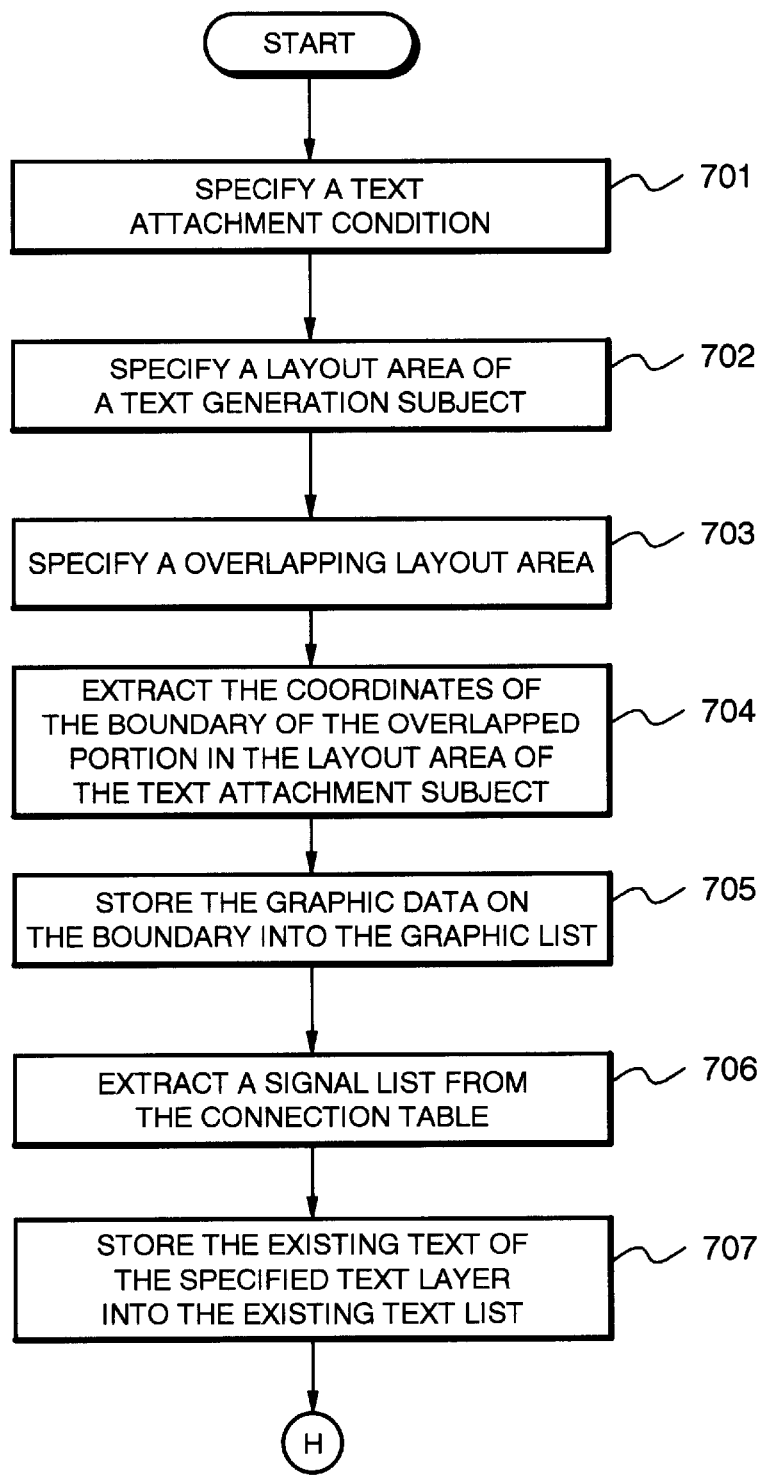
FIG. 7 is a flow chart showing the text generating method according to the embodiment and a view showing the operation in the case where a text generation specified area is within a layout area.
Figure 8:
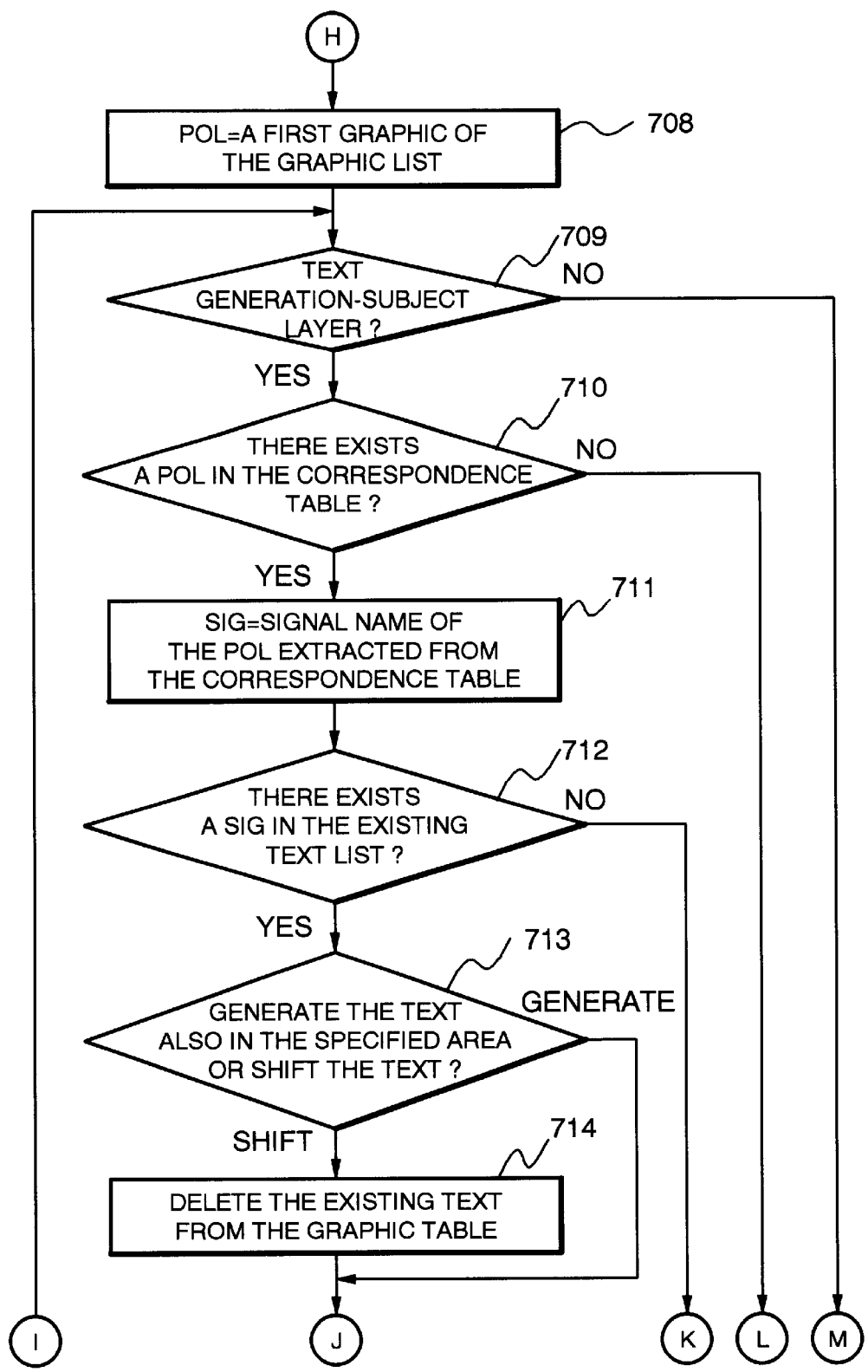
FIG. 8 is a flow chart showing the text generating method according to the embodiment and a view showing the operation in the case where a text generation specified area is within a layout area.
Figure 9:
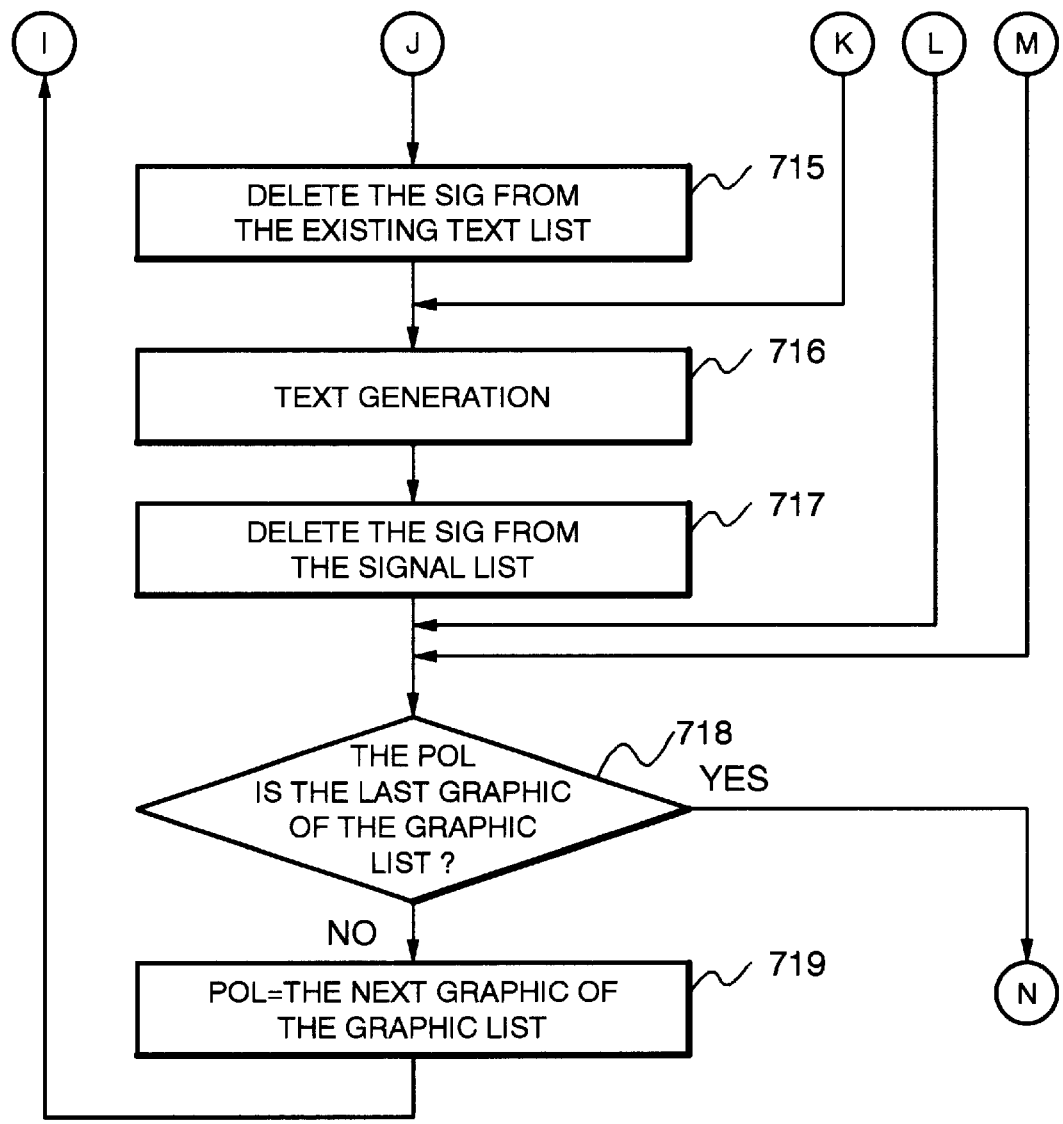
FIG. 9 is a flow chart showing the text generating method according to the embodiment and a view showing the operation in the case where a text generation specified area is within a layout area.
Figure 10:
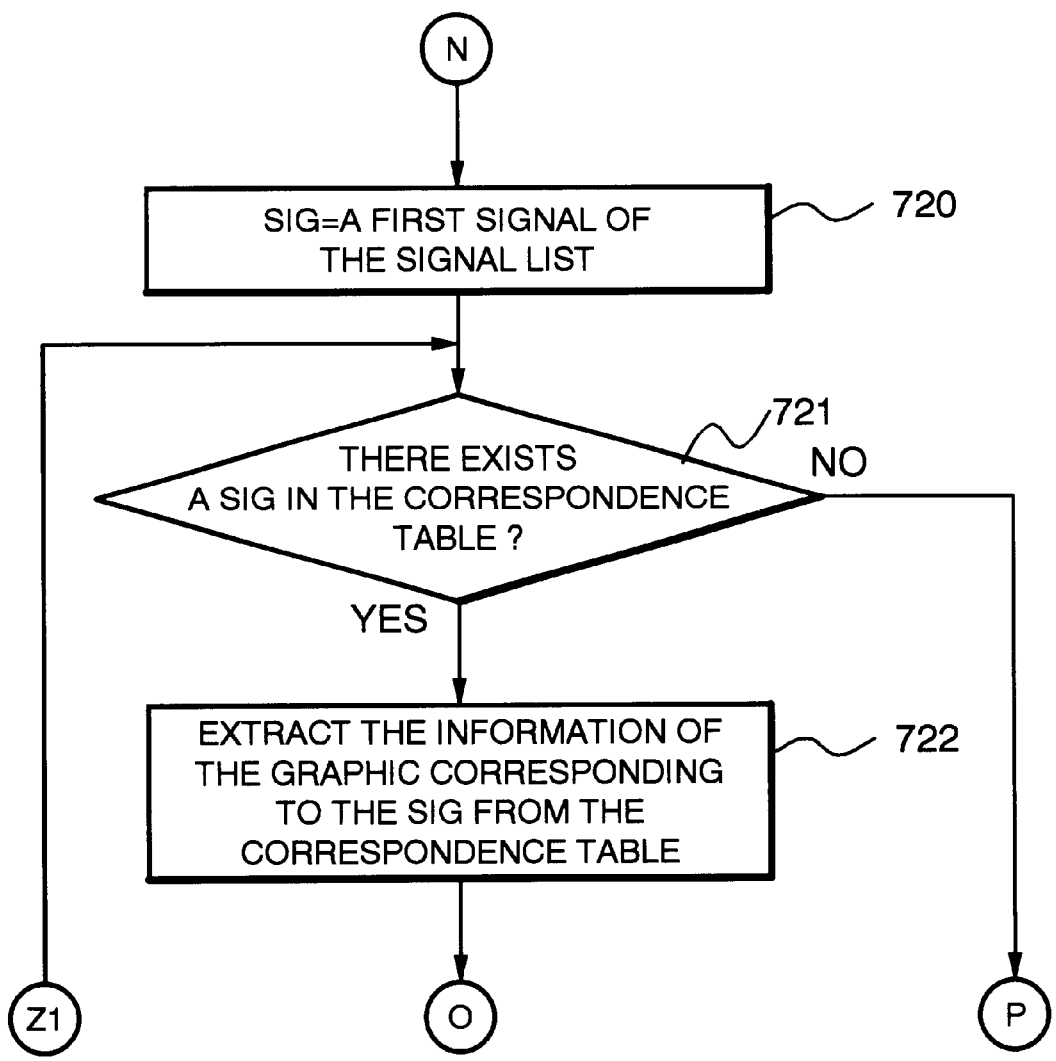
FIG. 10 is a flow chart showing the text generating method according to the embodiment and a view showing the operation in the case where a text generation specified area is within a layout area.
Figure 11:
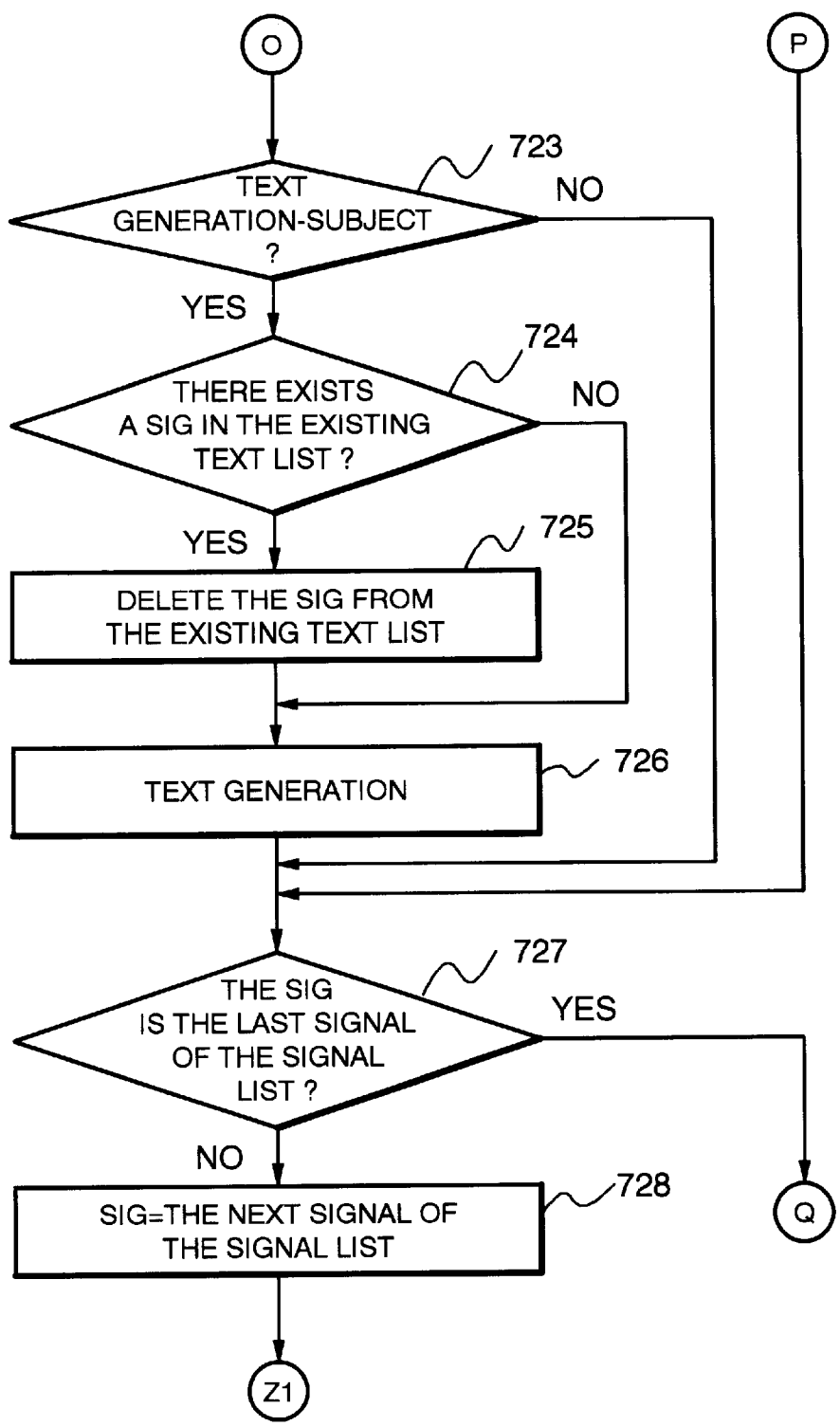
FIG. 11 is a flow chart showing the text generating method according to the embodiment and a view showing the operation in the case where a text generation specified area is within a layout area.

FIG. 1 is a block diagram showing the constitution of a layout editor according to an embodiment of the present invention. With reference to FIG. 1, the layout editor of the embodiment comprises a text attachment condition specifying unit 101, a text generation area specifying unit 102, a specified area information extracting unit 103, a specified area/graphic data AND generating unit 104, a signal name extracting unit 105, a text generation judging unit 106 including an existing text comparing unit 107, a text generating unit 108, a connection table 109 for storing the connection information, a graphics/signals correspondence table 110 for storing the information on the correspondence relationship between the graphic data and the connection, a graphic table 111 for storing graphic data, a signal list extracting unit 112, an existing text list extracting unit 113, a signal list 114, and an existing text list 115. In FIG. 1, net-driven data is formed in the connection table 109, the graphics/signals correspondence table 110, and the graphic table 111. FIG. 1 shows only the characteristic components of this embodiment and the other general components are not shown therein. It is needless to say that the layout editor actually includes a display for displaying graphics and texts and an input device for entering data or instruction by a user.

The basic points will be described in the text generating method by the layout editor of the embodiment shown in FIG. 1. This embodiment employs, as a method of specifying the text generating position, a method of specifying a text by the line or the rectangle with a mouse or the other pointing device and a method of specifying a text generation area by the layout area or the block boundary that is a specified format. As the case of generating a text, a text may be generated in case of no text existing or in case of some text existing. In case of some text existing, the text may be shifted at a specified position or another text may be also generated at a specified position.

In the method of specifying the text generation area by the line or the rectangle with a pointing device, a text is generated by searching for a signal of the graphic data existing within a specified area according to the AND of the specified area and the graphic data. If necessary, with respect to the remaining signals, a text is generated at the origin of the graphic or at the center of the graphic, by searching for the graphic from the correspondence table within the data base. In the method of specifying the text generation area by the layout area that is a particular format, the AND of the graphic data and the coordinates of the boundary of the specified format, that is, the layout area is required and the signal of the graphic data of the boundary of the layout area is searched by the priority, so to generate a text. With respect to the remaining signals, a text is generated at the origin of the graphic and at the center of the graphic, by searching for the graphic from the correspondence table. In the method of specifying the text generation area by the block boundary that is the particular format, an input/output port of signal is searched from the connection information of the signal table and the coordinates of the searched input/output port and the presence of the connection graphic is checked, according to the correspondence table. When there exists the connection information, a text is generated at the medial point of the AND of the connection graphic and the input/output port. With respect to the remaining signals, the graphic is searched from the correspondence table and a text is generated at the origin of the graphic and at the center of the graphic. When a text is generated with no text existing, a text is generated based on the signal table.

When the text is shifted to a specified position in case of a text existing, the signal name of the graphic data within the specified area is extracted and a step of deleting the same text on the layout data is newly added. This step generates the same state as that of the text being shifted to a specified position, on the data. With a comparison between the existing text on the layout and the signal list 114, a necessary text is generated on the layout without any miss of signal name. When the text is generated also in a specified position in case of a text existing, the text is generated within the specified area and thereafter a necessary text is generated on the layout without any miss of signal name by comparison between the existing text on the layout and the signal list 114.

The above-mentioned text generating method enables it to generate a text at the position where an operator can see it easily without any miss in the post-processing work.

In the layout editor of the embodiment shown in FIG. 1, the text attachment condition specifying unit 101 may be realized by, for example, a CPU controlled by a program and a memory such as a RAM or the like, and specifies the attachment condition for a text to be generated so as to generate the given text. In other words, it specifies a text layer to be generated, a subject layer to which a text is attached, and the manner of generating a text; that is, it is in case of text generation with no text existing, in the case where the text is shifted to a specified area with a text existing, or in the case where the text is generated also in a specified area with a text existing. In this embodiment, according to the specification of the subject layer to which a text is attached by the text attachment condition specifying unit 101 and the generation standard within the text generation judging unit 106 described later, only a particular layer is specified from the graphic pattern having a plurality of the subject layers overlapping together and a text is generated on the specified layer.

The text generation area specifying unit 102 may be realized by a CPU controlled by a program and a memory such as a RAM or the like. The unit 102 receives the attachment condition specified by the text attachment condition specifying unit 101 as well as the user's specification of the text generation area considering the work in the post-processing and delivers these specification information to the specified area information extracting unit 103.

The specified area information extracting unit 103 may be realized by, for example, a CPU controlled by a program and a memory such as a RAM or the like. The unit 103, upon receipt of the specification information from the text generation area specifying unit 102, extracts the coordinates of the specified area according to the specification information as well as necessary information from the graphics/signals correspondence table 110 and the graphic table 111.

The specified area/graphic data AND generating unit 104 may be realized by, for example, a CPU controlled by a program and a memory such as a RAM or the like. The unit 104 performs an AND operation of the coordinates of the specified area extracted by the specified area information extracting unit 103 and the graphic data of the graphic table 111 and supplies the obtained AND to the signal name extracting unit 105.

The signal name extracting unit 105 may be realized by, for example, a CPU controlled by a program and a memory such as a RAM or the like. Upon receipt of the AND output from the specified area/graphic data AND generating unit 104, the unit 105 extracts the signal name of the graphic data corresponding to the AND output and delivers it to the text generation judging unit 106.

The text generation judging unit 106 may be realized by, for example, a CPU controlled by a program and a memory such as a RAM or the like. Upon receipt of the signal name of the graphic data extracted by the signal name extracting unit 105, the unit 106 judges whether the signal name is to generate a text, and whether the graphic data is on the graphic of the text attachment-subject layer specified by the specification information supplied from the text attachment condition specifying unit 101.

The text generation judging unit 106 is provided with the existing text comparing unit 107. When the text attachment condition specifying unit 101 specifies that the existing text is further generated also in a specified area, the unit 106 judges whether there exists the same signal name as the signal within the signal list 114 in the existing text stored in the existing text list 115 and supplies the judgement signal showing the judgement results to the text generating unit 108. The connection information is extracted from the connection table 109 by the signal list extracting unit 112 and stored in the signal list 114. The graphic data is extracted from the graphic table 111 by the existing text list extracting unit 113 and stored in the existing text list 115. In this case, the graphic data extracted from the graphic table 111 is on the existing text corresponding to the number of layer specified by the text attachment condition specifying unit 101.

The text generating unit 108 may be realized by, for example, a CPU controlled by a program and a memory such as a RAM or the like, and generates a text corresponding to the graphic which exists in the text generation area. The existing text is deleted from the graphic list 111 at first. A new text is generated and stored in the graphic table 111. The generated signal name is deleted from the signal list 114 and the existing text list 115. After generating a text corresponding to the graphic which exists in the text generation area, a text corresponding to the signal remaining in the signal list 114 is generated. In the text generation, when the text attachment condition specifying unit 101 specifies the shift of a text, there exists the same signal name as the signal of the signal list 114, in the existing text list 115, so that the existing text list 115 is deleted from the graphic table 111. The signal name of the generated text is deleted from the signal list 114 and the existing text list 115. Thus, the signal name of the generated text will be deleted from the signal list 114 and the existing text list 115 one after another and the above operation will be repeated until when there is no signal left in the signal list 114. In these ways, each text for the whole signal names within the signal list 114 is checked and generated without any miss.

This time, the text generation method by the layout editor of the embodiment will be described. FIGS. 2, 3, 4, 5, and 6 are flow charts showing the operation of the text generation in the case where the text generation specified area is a line or a rectangle. With reference to FIGS. 2 to 6, the text attachment condition is first specified by the text attachment condition specifying unit 101 (Step 201 in FIG. 2), and the text generation area is specified by the text generation area specifying unit 102 (Step 202).

Figure 19:
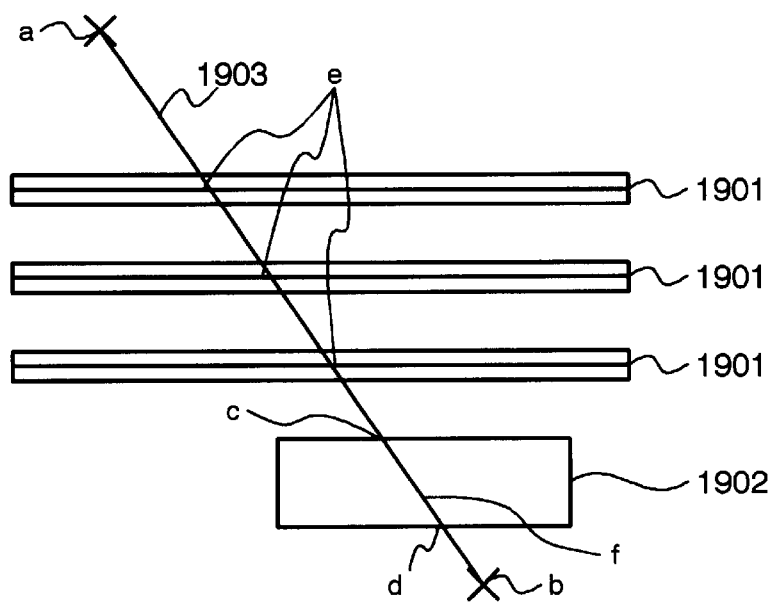
FIG. 19 is a view showing the constitution example of the display screen of the layout editor in the case where the text generation specified area is a line in the text generating methods of FIGS. 2 to 6.
Figure 20:
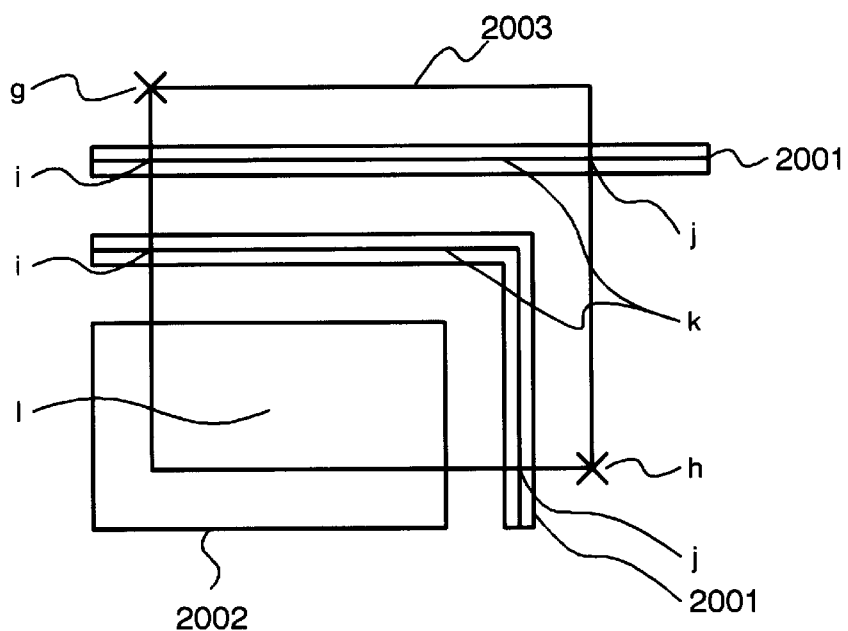
FIG. 20 is a view showing the constitution example of the display screen of the layout editor in the case where the text generation specified area is a rectangle in the text generating methods of FIGS. 2 to 6.

The wiring pattern within the layout data will be briefly described here for the sake of the description hereinafter. FIGS. 19 and 20 are views each showing an example of the wiring pattern displayed according to the layout data corresponding to the embodiment. FIG. 19 is a view showing the display screen of the layout editor when the text generation specified area is a line, and FIG. 20 is a view showing the display screen of the layout editor when the text generation specified area is a rectangle. When the specified area is specified by the line, a path 1901 that is a line having a width as the form of the graphic data and a polygon 1902 occupying the polygonal area having three vertexes and the more are shown in FIG. 19. The mark x is shown on the first clicked point 'a' and the second clicked point 'b' by the pointing device of the layout editor. The line 'ab' interconnecting the points 'a' and 'b' is shown as a ghost graphic 1903 in the layout editor, and the text generation area is specified by the line of this ghost graphic 1903. In FIG. 19, the point 'c' and the point 'd' are the intersections of the polygon 1902 and the line 'ab', the point 'e' is the intersection of the path 1902 and the line 'ab', and the point 'f' is the medial point of the portion 'cd' corresponding to the polygon 1902, of the line 'ab'. While, when the specified area is specified by the rectangle, the mark x is shown on the first clicked point 'g' and the second clicked point 'h' by the pointing device of the layout editor in correspondence with the path 2001 and the polygon 2002, in FIG. 20. These points 'g' and 'h' are fixed as the vertexes of opposite angle and the rectangle 'gh' is shown on the layout editor as a ghost graphic 2003. The text generation area is specified by the rectangle of this ghost graphic 2003. In FIG. 20, the point 'i' and the point 'j' are the intersections between the center of the path 2001 and the ghost graphic 2003, the point 'k' is the intersection between the center of the path 2001 and the half point of the line 'ij', and the point 'l' is the center of AND of the polygon 2002 and the ghost graphic 2003.

The description will be returned to the flow chart. After specification of the text generation area, the specified area information extracting unit 103 extracts the coordinates of the specified area (Step 203). When the specified area is specified by the line as illustrated in FIG. 19, the line 'ab', is extracted, and when the specified area is specified by the rectangle as illustrated in FIG. 20, the rectangle 'gh' is extracted. The specified area/graphic data AND [] generating unit 104 calculates the AND of the specified area and the graphic data and stores it into the graphic list (Step 204). Further, the signal list extracting unit 112 extracts the signal list 114 from the connection table 109 (Step 205). The existing text list extracting unit 113 stores the existing text of a specified text layer into the subject layer of the existing text list 115 (Step 206). Here, if the data having no text, the existing text list 115 becomes empty. The text generation judging unit 106 assigns a first graphic to a temporary area POL (Step 207 in FIG. 3), and judges whether the temporary area POL is the text generation-subject layer or not (Step 208). When it is not the text generation-subject layer, the step will move to Step 217 (refer to FIG. 4), where it is judged whether the temporary area POL is the last graphic of the graphic list or not. On the other hand, when the temporary area POL is the text generation-subject layer, it judges whether there exists the temporary area POL in the graphics/signals correspondence table 110 or not (Step 209). When the temporary POL doesn't exist within the graphics/signals correspondence table 110, the step will move to Step 217 (refer to FIG. 4), where it is judged whether the temporary area POL is the last graphic of the graphic list or not. On the other hand, when the temporary area POL exists within the graphics/signals correspondence table 110, the signal name extracting unit 105 extracts the signal name of the temporary area POL from the graphics/signals correspondence table 110 and assigns it to the temporary area SIG (Step 210). The text generation judging unit 106 judges whether a temporary area exists in the existing text list 115 or not (Step 211 in FIG. 4). When no temporary area exists in the existing text list 115, the step will move to Step 215, where the text generating unit 108 generates the text of a specified text layer. While, when there exists a temporary area, it is judged whether it is in case of having a text already and generating the text also in a specified area or in case of shifting a text (Step 212). In case of generating the text already existing also in the specified area, the step will move to Step 214, where the text generating unit 108 deletes the temporary area SIG from the existing text list 115. While, in case of shifting a text, after deleting the existing text from the graphic table 111 (Step 213), the text generating unit 108 deletes the temporary area SIG from the existing text list 115 (Step 214). Thereafter, the text of the text specified layer is generated (Step 215).

The text generating position according to the above processing becomes the medial point of AND of the specified line and the graphic in case of specifying the text generation area by the line. More specifically, in FIG. 19, when the form of the graphic is a path, a text is generated on the intersection 'e' between the center line of the path 1901 and the line 'ab'. When the form of the graphic is a polygon, a text is generated on the medial point 'f' of the line 'cd' that is the AND of the graphic data and the line 'ab'. In case of specifying the text generation area by the rectangle, the text generating position is found at the center of the AND of the rectangle and the graphic. More specifically, in FIG. 20, when the form of the graphic is a path, a text is generated on the point 'k' equally distant from the point 'i' and the point 'j' on the line 'ij'. When the form of the graphic is a polygon, a text is generated at the center of the AND of the polygon 2002 and the rectangle 'gh'.

After generating a text as mentioned above, the text generating unit 108 deletes the temporary area SIG from the signal list 114 (Step 216) and the text generation judging unit 106 judges whether the temporary area POL is the last graphic of the graphic list or not (Step 217). If the temporary area POL is the last graphic of the graphic list, the step will move to Step 219 (refer to FIG. 5). If it is not the last graphic, the next graphic of the graphic list is assigned to the temporary area POL, thereby returning to Step 208 (refer to FIG. 3), and the procedure later than Step 208 will be repeated until when the temporary area POL becomes the last graphic of the graphic list (Step 218).

After generating each text with respect to all the graphics of the graphic list according to the above-mentioned procedure, the text generation judging unit 106 assigns a first signal name of the signal list 114 to the temporary area SIG (Step 219). The signal list 114 includes no signal name generated by the procedure before Step 218. The unit 106 judges whether a temporary area SIG exists in the graphics/ signals correspondence table 110 or not (Step 220), and when there exists no temporary area SIG, it is judged whether the temporary area SIG is the last signal of the signal list 114 or not (Step 226). While, when there exists a temporary area SIG, it obtains, from the graphics/signals correspondence table 110, the information about which graphic of which graphic table 111 the temporary area SIG corresponds to (Step 221). Based on the information obtained in Step 221, the unit 106 receives the information on the layer number, the coordinates of origin, and the coordinates of the vertexes of a graphic corresponding to the temporary area SIG in the graphic table 111, extracts the layer number of the graphic, and judges whether the graphic is a text generation-subject layer or not (Step 222). When the graphic is not the text generation-subject layer, the step will move to Step 226, where it is judged whether the temporary area SIG is the last signal of the signal list 114 or not. When the graphic is the text generation-subject layer, it is judged whether a temporary area SIG exists in the existing text list 115 (Step 223). When no temporary area SIG exists in the existing text list 115, the step will move to Step 225, where the text generating unit 108 generates a text. While, when a temporary area SIG exists in the existing text list 115, the text generating unit 108 deletes the temporary area SIG from the existing text list 115 (Step 224), and in Step 225, a text is generated. In this case, the text is generated at the center calculated from the information on the coordinates of origin or the coordinates of the vertexes of the graphics. This time, it is judged whether the temporary area SIG is the last signal of the signal list 114 or not (Step 226). When it is not the last signal, the step will move to Step 228 (refer to FIG. 6). When it is the last signal, the next signal of the signal list 114 is assigned to the temporary area SIG and the procedure later than Step 220 will be repeated (Step 227), to generate each text for all the remaining signals.

Thereafter, the text generation judging unit 106 judges whether there remains a text in the existing text list 115 or not (Step 228). Here, since the signals having existed in the signal list 114 have been deleted from the existing text list 115, it is checked whether there is some text which is not included in the connection information, as a text of a specified layer, namely whether a wrong text is disposed in the existing text list 115 or not. When no text exists in the existing text list 115, the processing will be terminated. While, when a text exists in the existing text list 115, a given message is supplied (Step 229) and it is judged whether the text of the graphic data in the graphic table 111 is deleted or not (Step 230). In this judgement, with reference to the existing texts remaining after Step 229, a user judges whether the text should remain as the graphic data or not and inputs the answer. When he or she judges that the text should remain without being deleted, the processing will be terminated promptly. When he or she judges that the text should be deleted, the processing will be stopped after deleting the text (Step 231).

FIGS. 7, 8, 9, 10, 11, and 12 are flow charts showing the operation of the text generation in the case where the text generation specified area is a layout area. With reference to FIGS. 7 to 12, the text attachment condition specifying unit 101 specifies the text attachment condition (Step 701 in FIG. 7) and the text generation area specifying unit 102 specifies a layout area that is the subject for attachment of a text (Step 702). It specifies another layout area overlapping with the specified layout area (Step 703).

Figure 21:
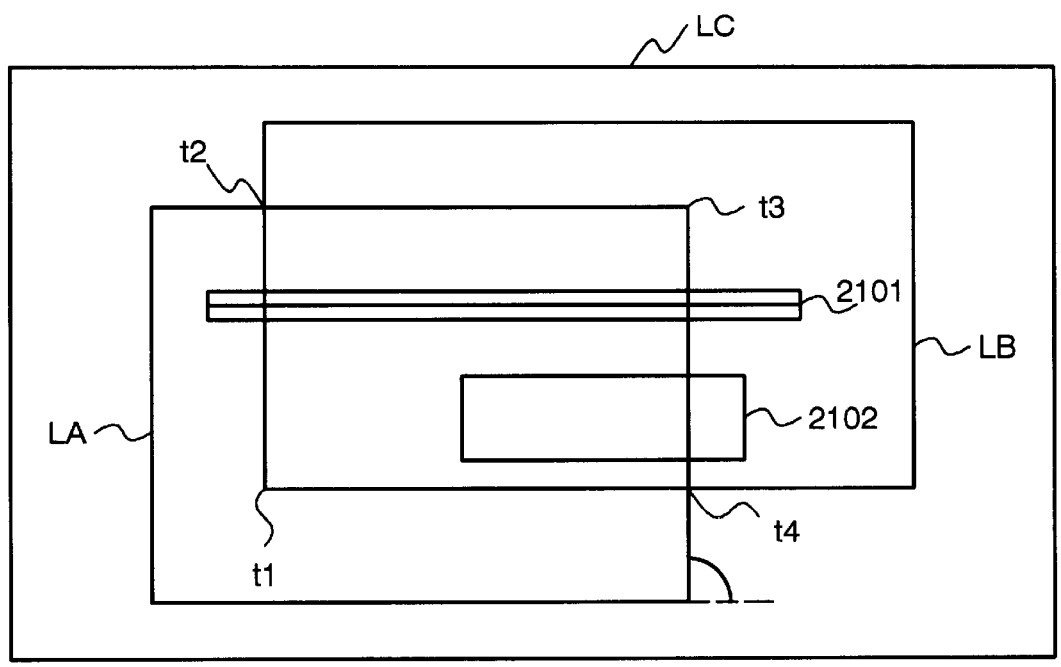
FIG. 21 is a view showing the constitution example of the display screen of the layout editor in the text generating methods of FIGS. 7 to 12.
Figure 22:
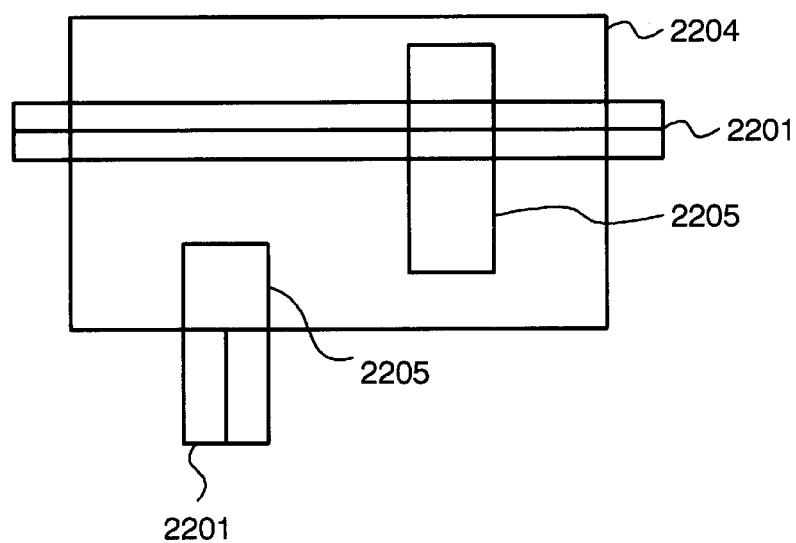
FIG. 22 is a view showing the constitution example of the display screen of the layout editor in the text generating methods of FIGS. 13 to 18.
Figure 23:
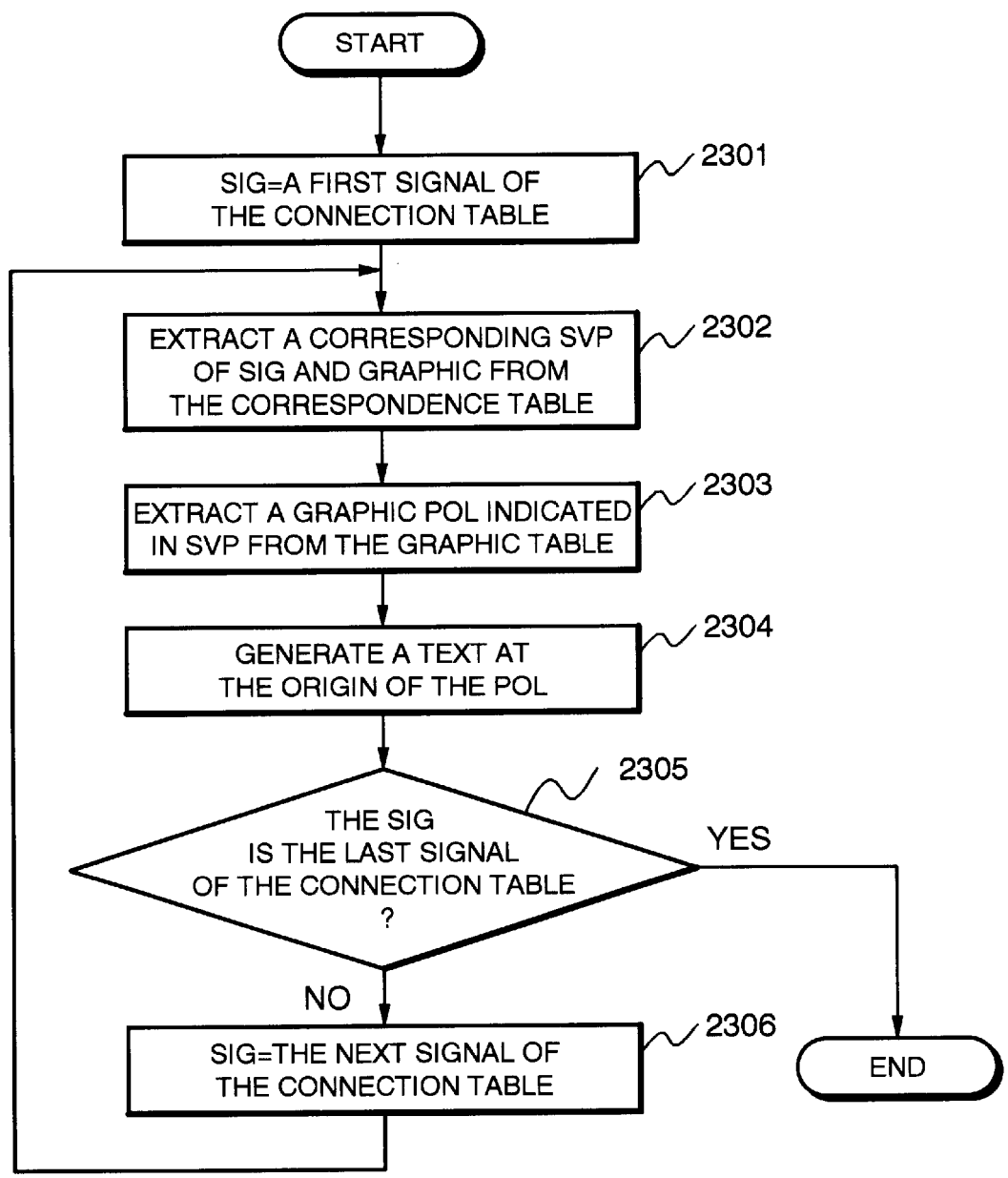
FIG. 23 is a flow chart showing the operation of a conventional text generating method.
Figure 24:
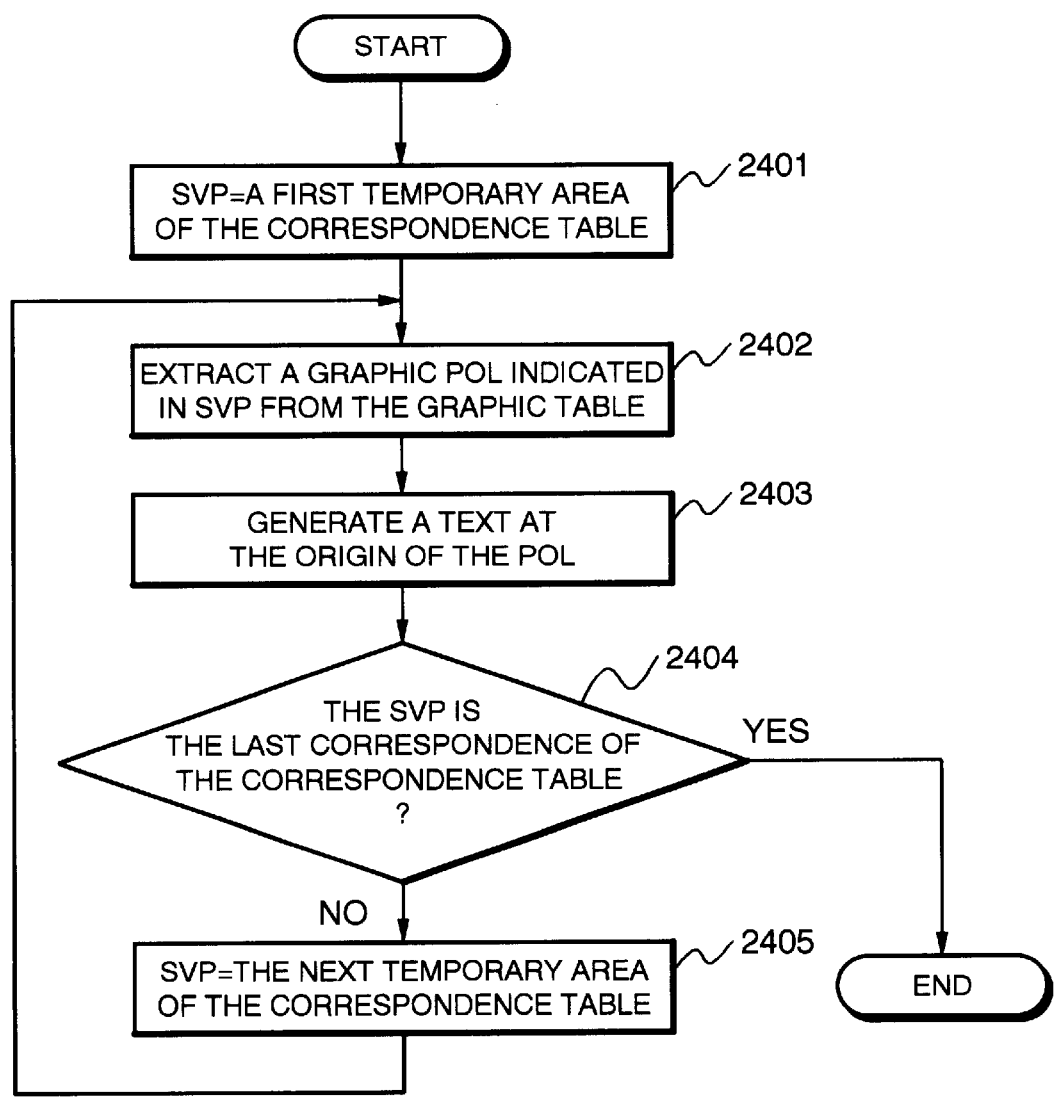
FIG. 24 is a flow chart showing the operation of another conventional text generating method.

Here, the display screen of the layout editor for use in describing the procedure of the text generating method will be explained with reference to FIG. 21. Assume that the data having the layer as illustrated in FIG. 21 is displayed on the display screen of the layout editor. In FIG. 21, an area LC is a layout area displayed on the layout editor and an area LA and an area LB are blocks of layout area disposed on the area LC. Of these areas, the area LB and the area LC don't necessarily have to be net-driven data, but the area LA must be net-driven data. Assume that the turning angle in disposing the area LA is θ. In FIG. 21, a path 2101 and a polygon 2102 are of the data having the connection information supplied to the area LA that is the subject layout area for attachment of a text, as a layer. The vertexes of the graphic of the overlapped portion of the area LA and the area LB are defined as 't1', 't2', 't3', and 't4'. The layout area specified in Step 702 corresponds to the layout area LA and the block name 'LA' is attached. Thus, a text is generated in the layout area LA. The layout area specified in Step 703 corresponds to the layout area LB and the block name 'LB' is attached.

Here, the description will be returned to the flow chart. After specifying the layout area, the specified area information extracting unit 103 extracts the coordinates of the boundary of the overlapped portion in the layout area that is the subject of text attachment (Step 704), and the specified area/graphic data AND generating unit 104 calculates the AND of the boundary and the graphic data and stores it into the graphic list (Step 705). Hereinafter, the coordinates of the boundary of the overlapped portion in the layout area that is the subject of text attachment will be described with reference to FIG. 21.

At first, the coordinates of origin (xLA, yLA) of the area LA in the upper area LC, the returning angle θ of the area LA and whether the area LA is revolved or not is extracted. The coordinates (xC1, yC1), (xC2, yC2), (xC3, yC3), and (xC4, yC4) of the vertexes 't1', 't2', 't3', and 't4' of the overlapped graphic of the area LA and the area LB in the area LC are extracted, and the coordinates (xA1, yA1), (xA2, yA2), (xA3, yA3), and (xA4, yA4) of the vertexes 't1', 't2', 't3', and 't4' in the area LA are obtained based on these coordinates. FIG. 21 shows neither x-axis nor y-axis of the coordinates, and instead of the description of these axes, the description will be made by use of conceptional symbol.

When the area LA doesn't turn half, the coordinates (xA1, yA1) to (xA4, yA4) are obtained by the following expression (1).

$$\begin{bmatrix} xA1 \\ yA1 \end{bmatrix} = \begin{bmatrix} \cos\theta & -\sin\theta \\ \sin\theta & \cos\theta \end{bmatrix} \begin{bmatrix} xC1 - xLA \\ yC1 - yLA \end{bmatrix} \\ \begin{bmatrix} xA2 \\ yA2 \end{bmatrix} = \begin{bmatrix} \cos\theta & -\sin\theta \\ \sin\theta & \cos\theta \end{bmatrix} \begin{bmatrix} xC2 - xLA \\ yC2 - yLA \end{bmatrix} \\ \begin{bmatrix} xA3 \\ yA3 \end{bmatrix} = \begin{bmatrix} \cos\theta & -\sin\theta \\ \sin\theta & \cos\theta \end{bmatrix} \begin{bmatrix} xC3 - xLA \\ yC3 - yLA \end{bmatrix} \\ \begin{bmatrix} xA4 \\ yA4 \end{bmatrix} = \begin{bmatrix} \cos\theta & -\sin\theta \\ \sin\theta & \cos\theta \end{bmatrix} \begin{bmatrix} xC4 - xLA \\ yC4 - yLA \end{bmatrix} \quad (1)$$

When the area LA half turns, the coordinates (xA1, yA1) to (xA4, yA4) are obtained by the following expression (2).

$$\begin{bmatrix} xA1 \\ yA1 \end{bmatrix} = \begin{bmatrix} -1 & 0 \\ 0 & 1 \end{bmatrix} \begin{bmatrix} \cos\theta & -\sin\theta \\ \sin\theta & \cos\theta \end{bmatrix} \begin{bmatrix} xC1 - xLA \\ yC1 - yLA \end{bmatrix} \\ \begin{bmatrix} xA2 \\ yA2 \end{bmatrix} = \begin{bmatrix} -1 & 0 \\ 0 & 1 \end{bmatrix} \begin{bmatrix} \cos\theta & -\sin\theta \\ \sin\theta & \cos\theta \end{bmatrix} \begin{bmatrix} xC2 - xLA \\ yC2 - yLA \end{bmatrix} \\ \begin{bmatrix} xA3 \\ yA3 \end{bmatrix} = \begin{bmatrix} -1 & 0 \\ 0 & 1 \end{bmatrix} \begin{bmatrix} \cos\theta & -\sin\theta \\ \sin\theta & \cos\theta \end{bmatrix} \begin{bmatrix} xC3 - xLA \\ yC3 - yLA \end{bmatrix} \\ \begin{bmatrix} xA4 \\ yA4 \end{bmatrix} = \begin{bmatrix} -1 & 0 \\ 0 & 1 \end{bmatrix} \begin{bmatrix} \cos\theta & -\sin\theta \\ \sin\theta & \cos\theta \end{bmatrix} \begin{bmatrix} xC4 - xLA \\ yC4 - yLA \end{bmatrix} \quad (2)$$

Figure 12:
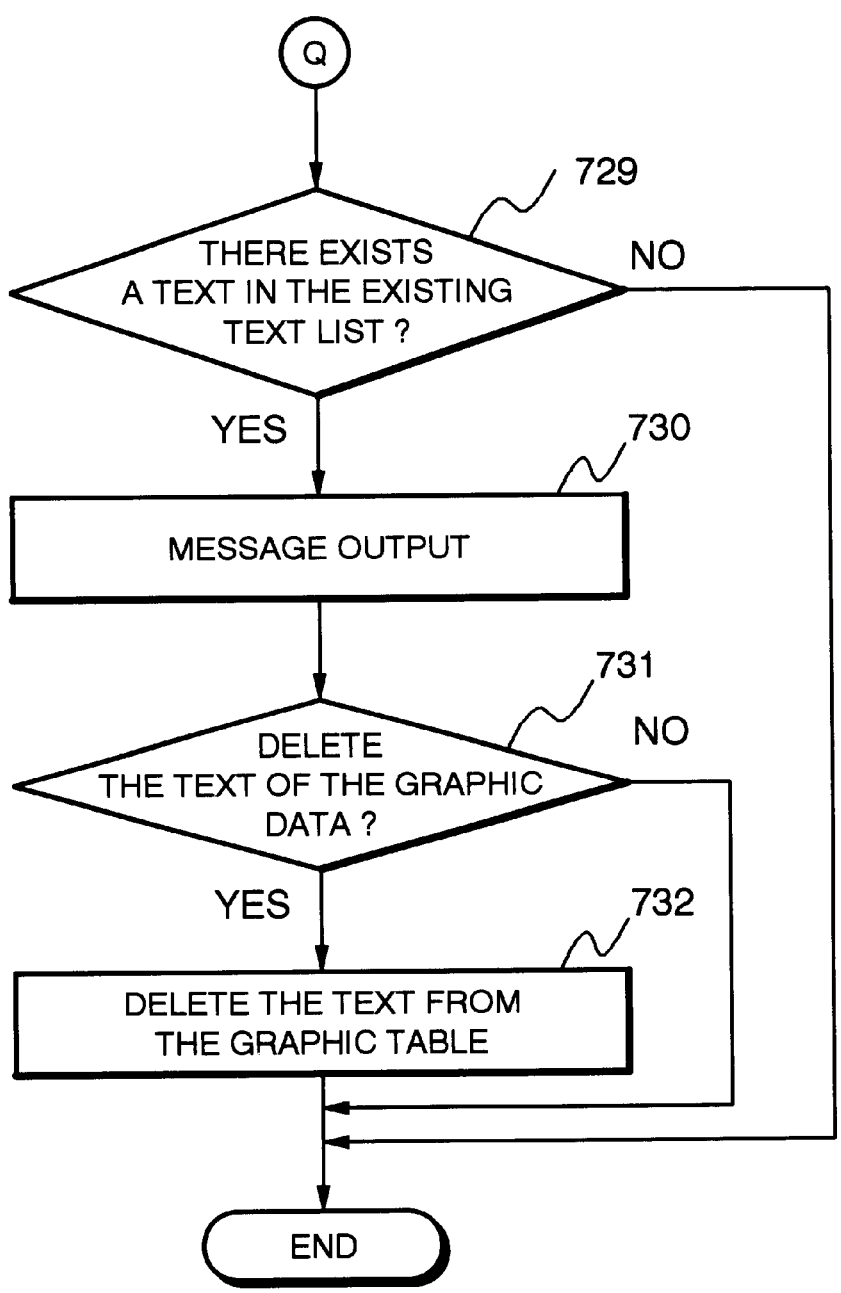
FIG. 12 is a flow chart showing the text generating method according to the embodiment and a view showing the operation in the case where a text generation specified area is within a layout area.
Figure 13:
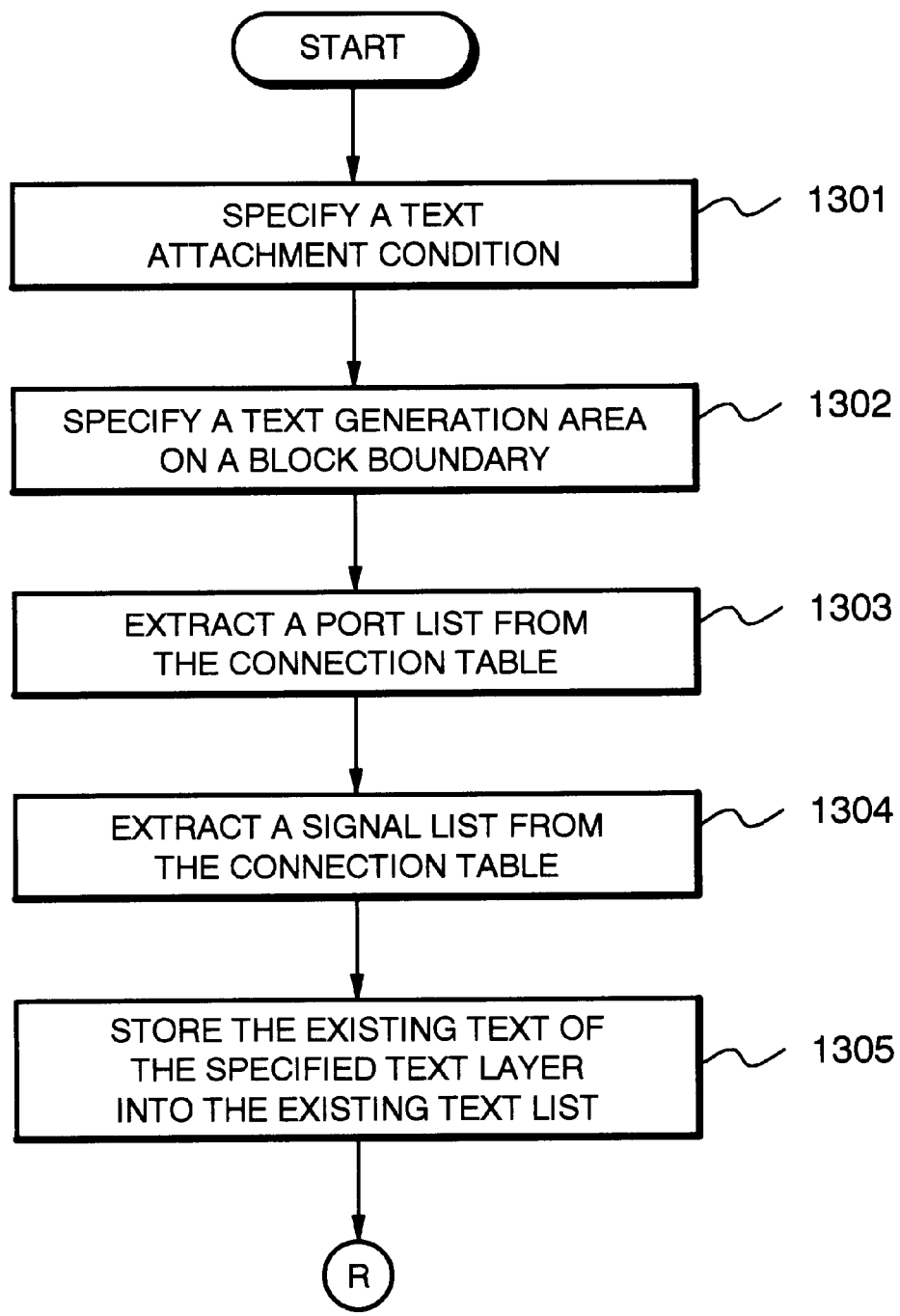
FIG. 13 is a flow chart showing the text generating method according to the embodiment and a view showing the operation in the case where a text generation specified area is in a port.
Figure 14:
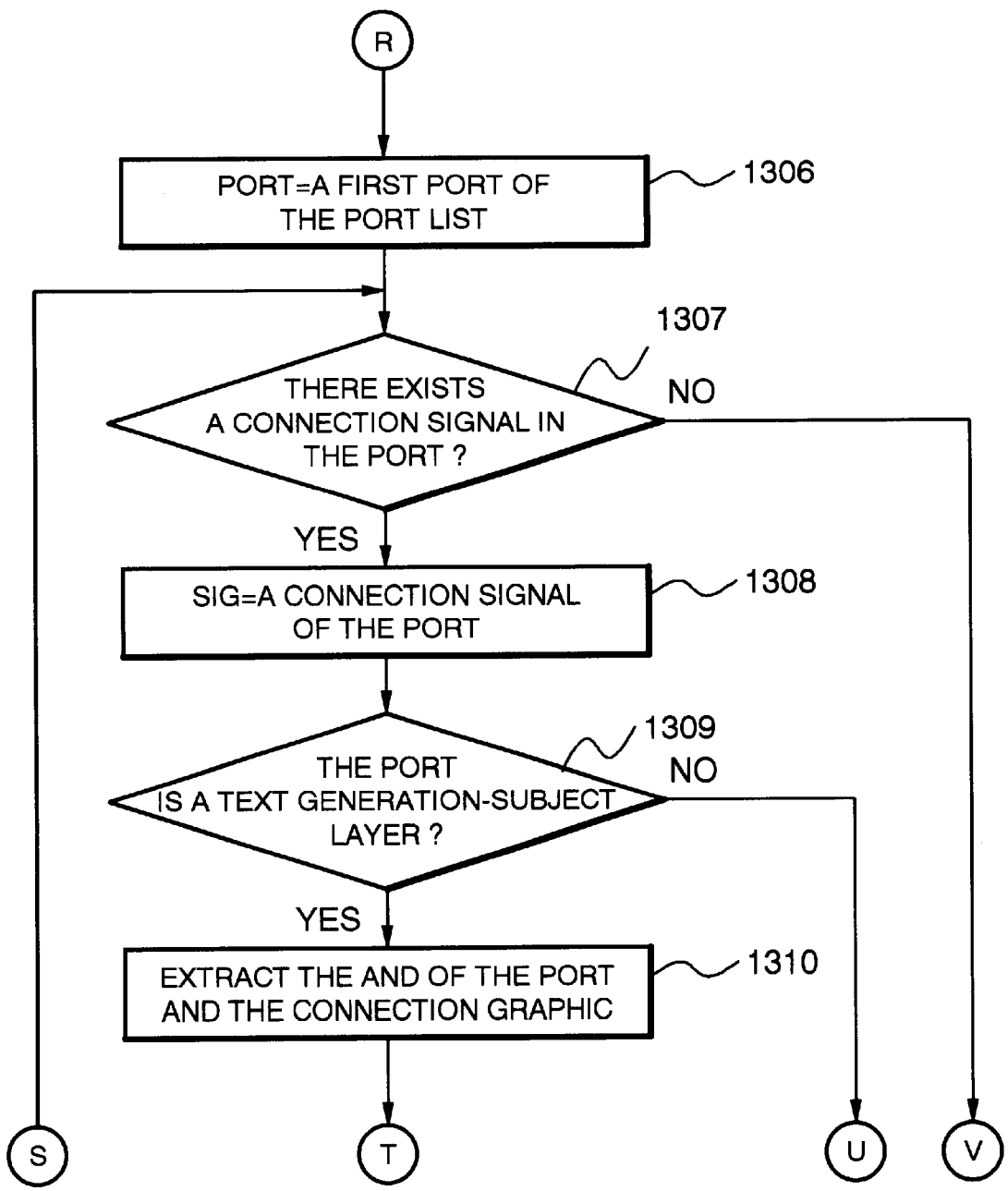
FIG. 14 is a flow chart showing the text generating method according to the embodiment and a view showing the operation in the case where a text generation specified area is in a port.
Figure 15:
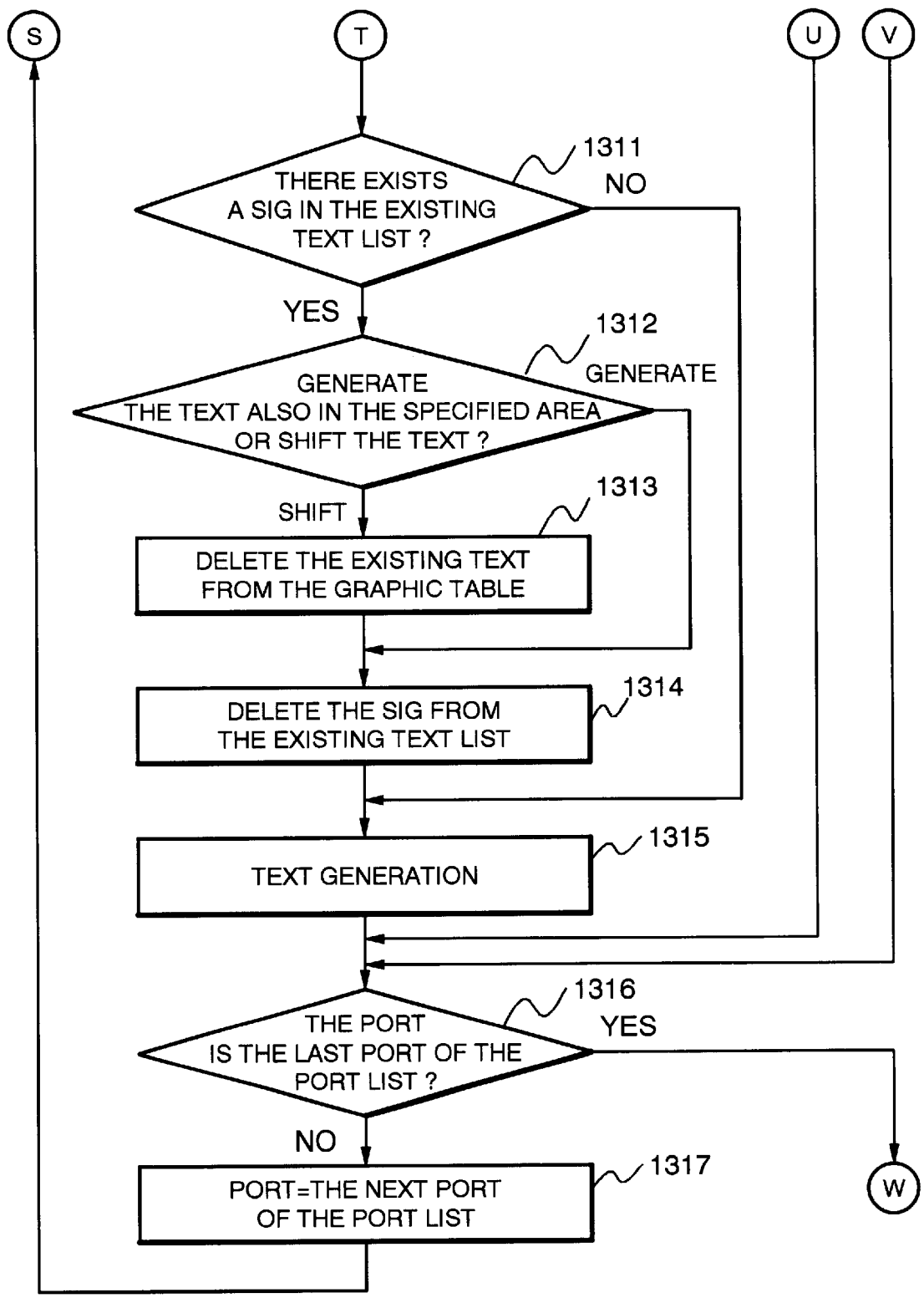
FIG. 15 is a flow chart showing the text generating method according to the embodiment and a view showing the operation in the case where a text generation specified area is in a port.
Figure 16:
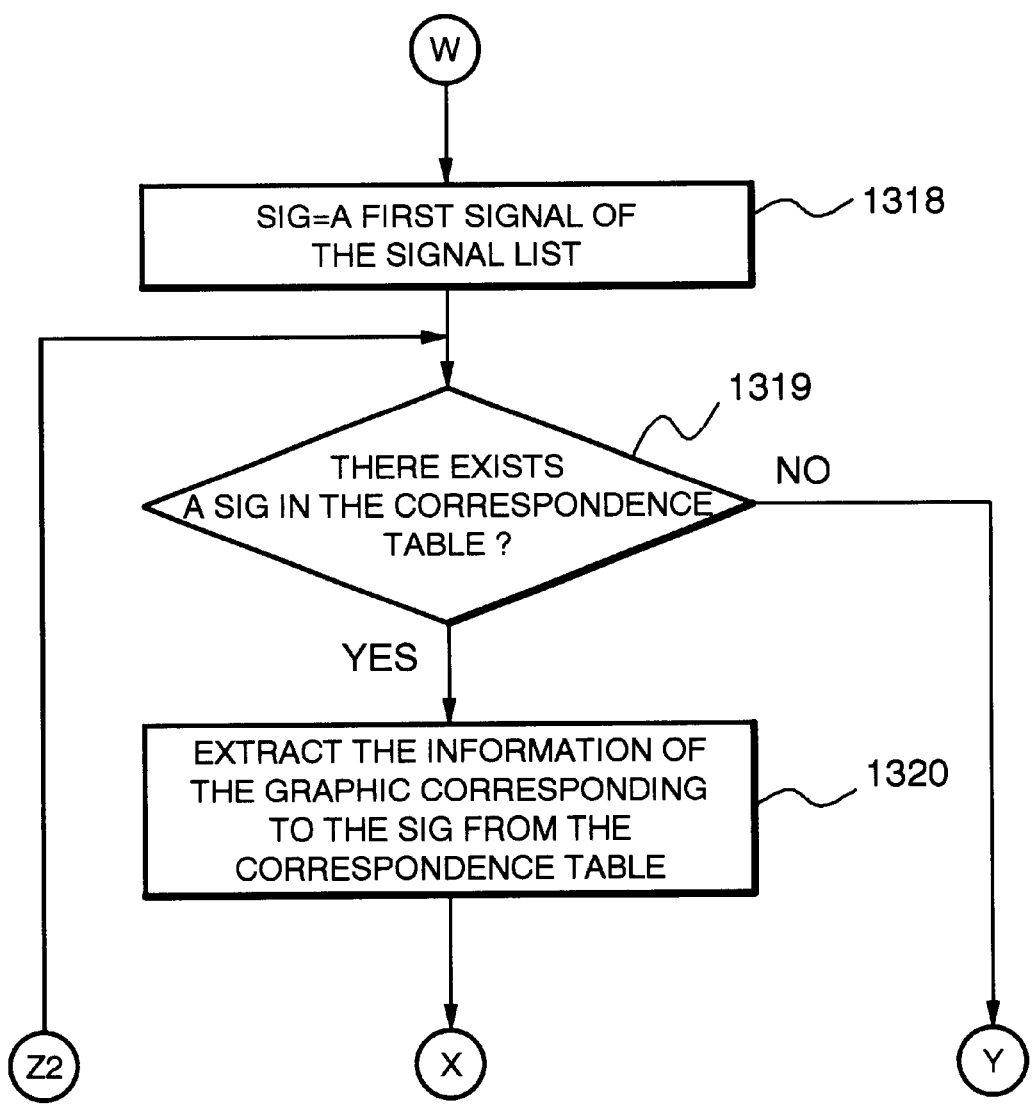
FIG. 16 is a flow chart showing the text generating method according to the embodiment and a view showing the operation in the case where a text generation specified area is in a port.
Figure 17:
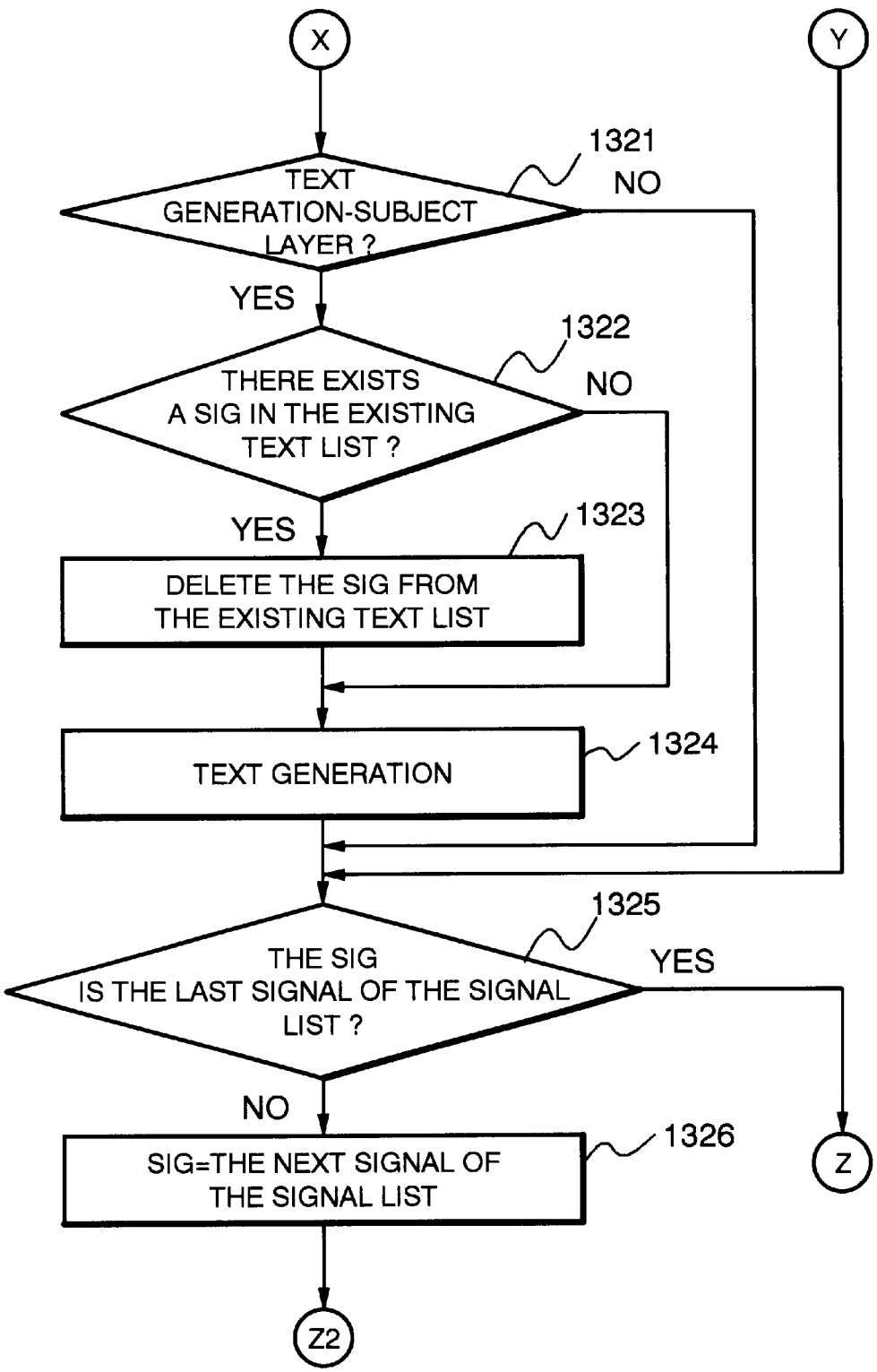
FIG. 17 is a flow chart showing the text generating method according to the embodiment and a view showing the operation in the case where a text generation specified area is in a port.

The coordinates of the line t1 - t2, t3 - t4, and t4 - t1 of the boundary of the overlapped graphics are obtained from the coordinates obtained by the above expression. After storing thus obtained graphic data into the graphic list, the signal list extracting unit 112 extracts the signal list 114 from the connection table 109 (Step 706), and the existing text list extracting unit 113 stores the existing text of a specified text layer into the existing text list 115 (Step 707). The procedure thereafter, namely the procedure from Step 708 in FIG. 8 to Step 732 in FIG. 12 is completely the same as the above-mentioned procedure from Step 207 in FIG. 3 to Step 231 in FIG. 6, thereby omitting the description.

As a result of the above-mentioned processing, the text generating position in the text specified area is found at the center of the AND of each line of the boundary and the graphic data. More specifically, in FIG. 21, the text generating position is at three points; intersections between the center of the path 2101 and each line 't1 - t2' and 't3 - t4', and the medial point of the line that is the AND of the line 't3 - t4' and the polygon 2102, on the layout area LA.

FIGS. 13, 14, 15, 16, 17, and 18 are flow charts showing the operation of the text generating method in the case where the text generation specified area is a port. With reference to FIGS. 13 to 18, the text attachment condition specifying unit 101 specifies the text attachment condition (Step 1301 in FIG. 13), and the text generation area specifying unit 102 specifies the block that is the text generation area (Step 1302). Generally, in the semiconductor integrated circuit, a pattern which forms the data is formed by a wiring pattern connecting a given functional block with another plurality of functional blocks and the boundary in correspondence to the input and output of the functional block is called as a port. Since net-driven data has the format of block and port, as the graphic information as well as the connection information, a text generation area can be specified by use of block or port. The specified area information extracting unit 103 extracts a port list from the connection table 109 (Step 1303), the signal list extracting unit 112 extracts the signal list 114 from the connection table 109 (Step 1304), and the existing text list extracting unit 113 extracts the existing text of a specified text layer from the graphic table 111 and stores it into the existing text list 115 (Step 1305). The specified area/graphic data AND generating unit 104 assigns a first signal of the port list to the temporary area PORT (Step 1306 in FIG. 14). It is judged whether a connection signal exists within the temporary area PORT or not (Step 1307). When no connection signal exists in the temporary area PORT, the step will move to Step 1316 (refer to FIG. 15), and when it exists there, the connection number of the temporary area PORT is assigned to the temporary area SIG (Step 1308). Based on the information on the graphics/signals correspondence table 110 and the graphic table 111, it is judged whether the temporary area PORT is the text generation-subject layer or not (Step 1309). When the temporary area PORT is not the text generation-subject layer, the step will move to Step 1316, and when it is the text generation-subject layer, the AND of the temporary area PORT and the connection graphic is extracted (Step 1310).

The text generation judging unit 106 judges whether a temporary area SIG exists within the existing text list 115 or not (Step 1311). When no temporary area SIG exists there, the step will move to Step 1315, and when there exists a temporary area SIG, it is further judged whether it is in case of generating a text already existing also in a specified area or in case of shifting a text (Step 1312). In case of generating a text also in a specified area, the text generating unit 108 deletes the temporary area SIG from the existing text list 115 (Step 1314). While, in case of shifting a text, the text generating unit 108 deletes the existing text from the graphic table 111 (Step 1313) and the temporary area SIG from the existing text list 115 (Step 1314). The text generating unit 108 generates the text of the text specified layer (Step 1315). Here, the text generating position is found at the medial point of the AND of the port and the graphic that is the wiring pattern to be connected to this port.

Figure 18:
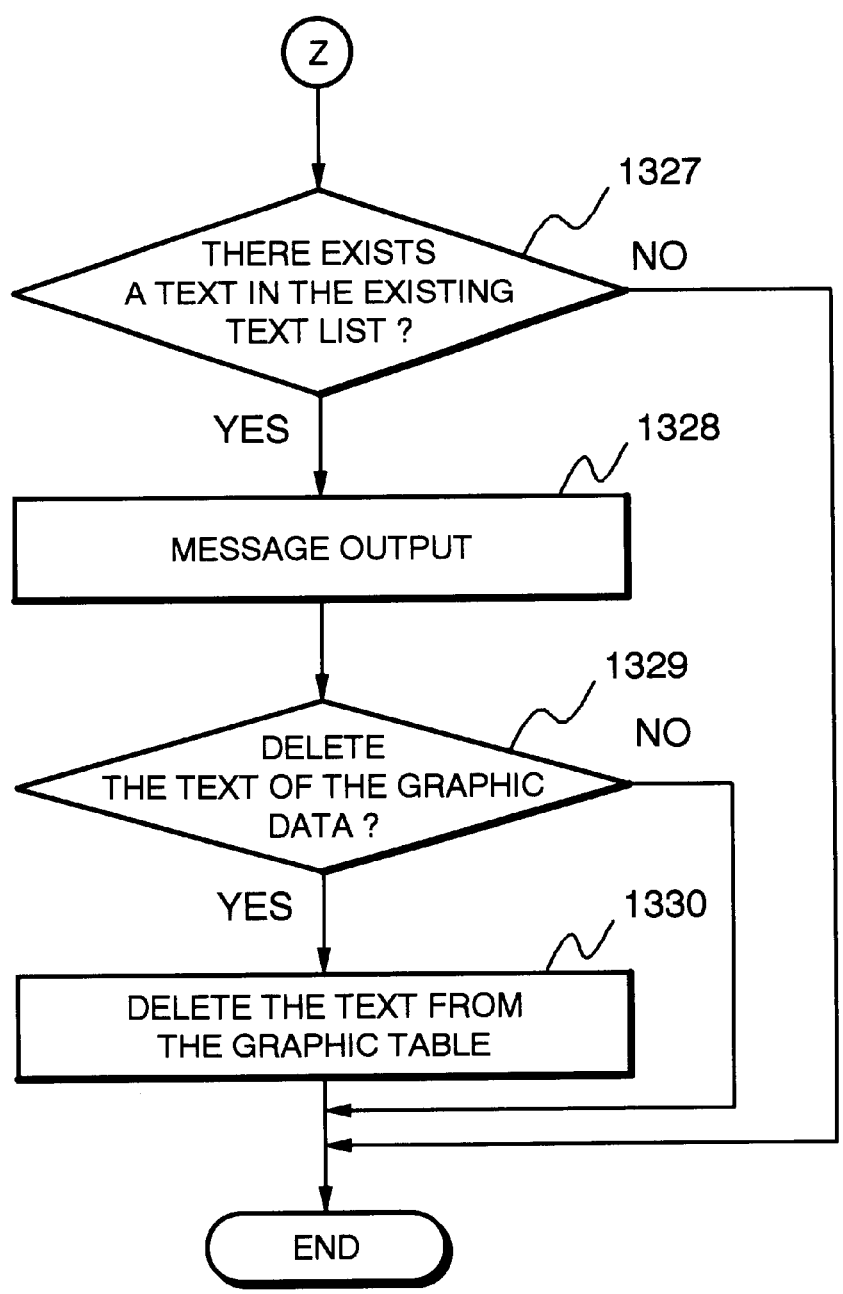
FIG. 18 is a flow chart showing the text generating method according to the embodiment and a view showing the operation in the case where a text generation specified area is in a port.

The text generation judging unit 106 judges whether the temporary area PORT of the subject for processing is the last port of the port list or not (Step 1316). When the temporary area PORT is not the last port, the next port of the port list is assigned to the temporary area PORT (Step 1317), and the procedure later than Step 1307 will be repeated until when the temporary area PORT becomes the last port of the port list. While, when the temporary area PORT is the last port of the port list, a first signal of the signal list 114 is assigned to the temporary area SIG (Step 1318 in FIG. 16). The procedure thereafter, namely, the procedure from Step 1318 in FIG. 16 to Step 1330 in FIG. 18 is completely the same as the above-mentioned procedure from Step 207 in FIG. 3 to Step 231 in FIG. 6, thereby omitting their description.

In the above-described processing, a text is automatically generated at a specified position without any miss and generation amount of the text is optimized.

As set forth hereinabove, the layout editor and its text generating method of the present invention can generate a text at the position easy to see in the display area or in the output range without missing any text, and can prevent texts from overlapping with each other depending on the manner of the specification of text generation area.

Further, it can shorten the data access time spent in the text generation at the design work, by restraining and optimizing the data amount required for the text generation, thereby improving the working efficiency.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A layout editor for use in a CAD system for the purpose of semiconductor integrated circuit design, comprising:

text attachment condition specifying means for specifying an attachment condition for a text to be generated, in order to generate a given text;

text generation area specifying means, receiving the attachment condition specified by said text attachment condition specifying means, for specifying a text generation area by user's input;

specified area information extracting means for extracting the coordinates of the specified area according to the specification information specified by said text generation area specifying means and extracting necessary information from a connection table, a graphics/signals correspondence table, and a graphic table;

specified area/graphic data AND generating means for performing an AND operation of the graphic data of the graphic table and the coordinates of the specified area extracted by said specified area information extracting means;

signal name extracting means for extracting signal name of the graphic data corresponding to the AND output by said specified area/graphic data AND generating means;

signal list extracting means for extracting connection information from the connection table, to create a signal list;

existing text list extracting means for extracting the graphic data corresponding to an existing text which meets the attachment condition specified by said text attachment condition specifying means, from the graphic table, to create an existing text list;

text generation judging means, receiving the attachment condition specified by said text attachment condition specifying means and the signal name extracted by said signal name extracting means, for judging the manner of text generation with reference to the signal list and the existing text list; and text generating means for generating or deleting a text according to the judgement result by said text generation judging means in correspondence with the attachment condition by said text attachment condition specifying means.

2. A layout editor as set forth in claim 1, wherein said text generation area specifying means specifies a text generation area according to a given graphic received by user's input with a given pointing device.

3. A layout editor as set forth in claim 1, wherein said text generation area specifying means specifies a text generation area according to a given line received by user's input with a given pointing device.

4. A layout editor as set forth claim 1, wherein said text generation area specifying means specifies a text generation area according to a given rectangle received by user's input with a given pointing device.

5. A layout editor as set forth in claim 1, wherein said text generation area specifying means specifies a text generation area, by user's specifying a layout area that is the subject of text generation according to a particular format.

6. A layout editor as set forth in claim 1, wherein said text generation area specifying means specifies a text generation area by user's specifying a block boundary that is the subject of text generation according to a particular format.

7. A text generating method in a layout editor for use in a CAD system for the purpose of semiconductor integrated circuit design, comprising the steps of:

a step of specifying an attachment condition including a manner of text generation;

a step of specifying a text generation area;

a step of obtaining all the graphic data of the graphic on which a text should be generated, according to the attachment condition specified by said attachment condition specifying step and the information on the text generation area specified by said text generation area specifying step;

a step of obtaining all the signal names of the graphic data obtained by said graphic data obtaining step;

a step of judging whether or not to generate a text of each signal name obtained by said signal name obtaining step, according to a given rule depending on the manner of the text generation in the attachment condition specified by said attachment condition specifying step; and a step of generating a text judged to be generated by said judging step, in the text generation area specified by said text generation area specifying step.

8. A text generating method as set forth in claim 7, wherein said text generation area specifying step including a step of indicating a text generation area by user's input, a step of extracting the coordinates of the area specified by said text generation area indicating step, and a step of calculating the AND of the given graphic data and the area specified by said text generation area indicating step.

9. A text generating method as set forth in claim 7, wherein said text generation area specifying step including a step of indicating a layout area to generate a text by user's input, a step of indicating another layout area overlapping with the above-mentioned layout area specified by said text generation area indicating step, a step of extracting the coordinates of a boundary of the overlapped portion of the layout area specified by said text generation area indicating step and the other layout area specified by said overlapped area indicating step, and a step of calculating the AND of the coordinates of the boundary extracted by said coordinates extracting step and the given graphic data.

10. A text generating method as set forth in claim 7, wherein said text generation area specifying step including a step of indicating a block boundary to generate a text by user's input, a step of extracting a port list according to the given connection table, and instead of the step of obtaining all the graphic data of the graphic on which a text should be generated, according to the attachment condition specified by said attachment condition specifying step and the information on the text generation area specified by said text generation area specifying step and the step of obtaining all the signal names of the graphic data obtained by said graphic data obtaining step, further includes a step of obtaining all the connection information with respect to input/output contact of the block boundary to generate a text, according to the attachment condition specified by said attachment condition specifying step and the port list extracted by said port list extracting step of said text generation area specifying step, and a step of obtaining all the signal names of the connection signal corresponding to the connection information obtained by said connection information obtaining step.

11. A computer readable memory storing a computer program for controlling a layout editor for use in a CAD system for the purpose of semiconductor integrated circuit design, the computer program comprising the steps of:

a step of specifying an attachment condition including a manner of text generation;

a step of specifying a text generation area;

a step of obtaining all the graphic data of the graphic on which a text should be generated, according to the attachment condition specified by said attachment condition specifying step and the information on the text generation area specified by said text generation area specifying step;

a step of obtaining all the signal names of the graphic data obtained by said graphic data obtaining step;

a step of judging whether or not to generate a text of each signal name obtained by said signal name obtaining step, according to a given rule depending on the manner of the text generation in the attachment condition specified by said attachment condition specifying step; and a step of generating a text judged to be generated by said judging step, in the text generation area specified by said text generation area specifying step.

12. A computer readable memory as set forth in claim 11, wherein said text generation area specifying step of said control program including a step of indicating a text generation area by user's input, a step of extracting the coordinates of the area specified by said text generation area indicating step, and a step of calculating the AND of the given graphic data and the area specified by said text generation area indicating step.

13. A computer readable memory as set forth in claim 11, wherein said text generation area specifying step of said control program including a step of indicating a layout area to generate a text by user's input, a step of indicating another layout area overlapping with the above-mentioned layout area specified by said text generation area indicating step, a step of extracting the coordinates of a boundary of the overlapped portion of the layout area specified by said text generation area indicating step and the other layout area specified by said overlapped area indicating step, and a step of calculating the AND of the coordinates of the boundary extracted by said coordinates extracting step and the given graphic data.

14. A computer readable memory as set forth in claim 11, wherein said text generation area specifying step of said control program including a step of indicating a block boundary to generate a text by user's input, a step of extracting a port list according to the given connection table, and instead of the step of obtaining all the graphic data of the graphic on which a text should be generated, according to the attachment condition specified by said attachment condition specifying step and the information on the text generation area specified by said text generation area specifying step and the step of obtaining all the signal names of the graphic data obtained by said graphic data obtaining step, further includes a step of obtaining all the connection information with respect to input/output contact of the block boundary to generate a text, according to the attachment condition specified by said attachment condition specifying step and the port list extracted by said port list extracting step of said text generation area specifying step, and a step of obtaining all the signal names of the connection signal corresponding to the connection information obtained by said connection information obtaining step.

* * * * *